(12) United States Patent
Eldridge et al.

(10) Patent No.: US 7,112,841 B2
(45) Date of Patent: *Sep. 26, 2006

(54) GRADED COMPOSITION METAL OXIDE TUNNEL BARRIER INTERPOLY INSULATORS

(75) Inventors: Jerome M. Eldridge, Los Gatos, CA (US); Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/781,035

(22) Filed: Feb. 18, 2004

(65) Prior Publication Data

US 2004/0159863 A1 Aug. 19, 2004

Related U.S. Application Data

(63) Continuation of application No. 10/177,096, filed on Jun. 21, 2002, and a continuation-in-part of application No. 09/943,134, filed on Aug. 30, 2001.

(51) Int. Cl.
*H01L 29/76* (2006.01)

(52) U.S. Cl. .................. 257/314; 257/239; 257/315
(58) Field of Classification Search ................. 257/314, 257/239, 315
See application file for complete search history.

(56) References Cited

U.S. PATENT DOCUMENTS

| | | | |
|---|---|---|---|
| 4,295,150 A | 10/1981 | Adam | 357/54 |
| 4,412,902 A | 11/1983 | Michikami et al. | 204/192 |
| 4,449,205 A | 5/1984 | Hoffman | 365/182 |
| 4,495,219 A | 1/1985 | Kato et al. | 427/82 |
| 4,556,975 A | 12/1985 | Smith et al. | |
| 4,672,240 A | 6/1987 | Smith et al. | |
| 4,688,078 A | 8/1987 | Hseih | 257/321 |
| 4,717,943 A | 1/1988 | Wolf et al. | 357/23.5 |
| 4,757,360 A | 7/1988 | Faraone | 357/23.5 |
| 4,780,424 A | 10/1988 | Holler et al. | 437/29 |
| 4,794,565 A | 12/1988 | Wu et al. | 365/185 |
| 4,870,470 A | 9/1989 | Bass, Jr. et al. | 357/23.5 |
| 4,939,559 A | 7/1990 | DiMaria et al. | 257/38 |
| 5,042,011 A | 8/1991 | Casper et al. | 365/205 |
| 5,071,782 A | 12/1991 | Mori | 437/48 |
| 5,073,519 A | 12/1991 | Rodder | 438/269 |
| 5,153,880 A | 10/1992 | Owen et al. | |
| 5,280,205 A | 1/1994 | Green et al. | 307/530 |
| 5,350,738 A | 9/1994 | Hase et al. | 505/473 |
| 5,353,431 A | 10/1994 | Doyle et al. | |

(Continued)

OTHER PUBLICATIONS

Aarik, Jaan, et al., "Anomalous effect of temperature on atomic layer deposition of titanium oxide", *Journal of Crystal Growth*, (2000), pp. 531–537.

(Continued)

*Primary Examiner*—Tu-Tu Ho
(74) *Attorney, Agent, or Firm*—Schwegman, Lundberg, Woessner & Kluth, P.A.

(57) ABSTRACT

Structures and methods for programmable array type logic and/or memory devices with graded composition metal oxide tunnel barrier intergate insulators are provided. The programmable array type logic and/or memory devices include a floating gate transistor. The floating gate has a first source/drain region and a second source/drain region separated by a channel region in a substrate. A floating gate opposes the channel region and is separated therefrom by a gate oxide. A control gate opposes the floating gate and is separated from the floating gate by a compositionally graded mixed metal oxide tunnel barrier intergate insulator.

71 Claims, 20 Drawing Sheets

U.S. PATENT DOCUMENTS

| | | |
|---|---|---|
| 5,399,516 A | 3/1995 | Bergendahl et al. ............ 437/43 |
| 5,418,389 A | 5/1995 | Watanabe .................... 257/295 |
| 5,445,984 A | 8/1995 | Hong et al. ..................... 437/43 |
| 5,455,792 A | 10/1995 | Yi .......................... 365/185.12 |
| 5,497,494 A | 3/1996 | Combs et al. .............. 395/750 |
| 5,498,558 A | 3/1996 | Kapoor ......................... 437/43 |
| 5,508,544 A | 4/1996 | Shah ........................... 257/316 |
| 5,510,278 A | 4/1996 | Nguyen et al. ................ 437/40 |
| 5,600,592 A | 2/1997 | Atsumi et al. ......... 365/185.18 |
| 5,617,351 A | 4/1997 | Bertin et al. ........... 365/185.05 |
| 5,618,575 A | 4/1997 | Peter ............................. 427/8 |
| 5,618,761 A | 4/1997 | Eguchi et al. |
| 5,619,051 A | 4/1997 | Endo |
| 5,619,642 A | 4/1997 | Nielson et al. ......... 395/182.04 |
| 5,627,785 A | 5/1997 | Gilliam et al. ......... 365/189.01 |
| 5,646,430 A | 7/1997 | Kaya et al. .................. 257/322 |
| 5,677,867 A | 10/1997 | Hazani ...................... 365/185 |
| 5,691,209 A | 11/1997 | Liberkowski .................. 437/7 |
| 5,691,230 A | 11/1997 | Forbes ......................... 437/62 |
| 5,739,544 A | 4/1998 | Yuki et al. .................... 257/25 |
| 5,801,401 A | 9/1998 | Forbes ......................... 257/77 |
| 5,852,306 A | 12/1998 | Forbes ....................... 257/315 |
| 5,880,991 A | 3/1999 | Hsu et al. .................... 365/182 |
| 5,923,056 A | 7/1999 | Lee et al. ..................... 257/192 |
| 5,936,274 A | 8/1999 | Forbes et al. ............... 257/315 |
| 5,952,692 A | 9/1999 | Nakazato et al. ........... 257/321 |
| 5,973,355 A | 10/1999 | Shirai et al. |
| 5,981,350 A | 11/1999 | Geusic et al. ............... 438/386 |
| 5,986,932 A | 11/1999 | Ratnakumar et al. .. 365/185.07 |
| 5,991,225 A | 11/1999 | Forbes et al. ........... 365/230.06 |
| 6,025,228 A | 2/2000 | Ibok et al. .................... 438/261 |
| 6,025,627 A | 2/2000 | Forbes et al. ............... 257/321 |
| 6,031,263 A | 2/2000 | Forbes et al. ............... 257/315 |
| 6,069,380 A | 5/2000 | Chou et al. .................. 257/315 |
| 6,069,816 A | 5/2000 | Nishimura ................... 365/145 |
| 6,077,745 A | 6/2000 | Burns, Jr. et al. ........... 438/270 |
| 6,124,729 A | 9/2000 | Noble et al. .................. 326/41 |
| 6,127,227 A | 10/2000 | Lin et al. ..................... 438/261 |
| 6,134,175 A | 10/2000 | Forbes et al. .......... 365/230.06 |
| 6,135,175 A | 10/2000 | Gaudreault et al. .......... 144/4.1 |
| 6,141,238 A | 10/2000 | Forbes et al. ............... 365/145 |
| 6,141,248 A | 10/2000 | Forbes et al. .......... 365/185.08 |
| 6,143,636 A | 11/2000 | Forbes et al. ............... 438/587 |
| 6,153,468 A | 11/2000 | Forbes et al. ............... 438/257 |
| 6,163,049 A | 12/2000 | Bui .............................. 257/321 |
| 6,169,306 B1 | 1/2001 | Gardner et al. ............. 257/310 |
| 6,208,164 B1 | 3/2001 | Noble et al. .................. 326/41 |
| 6,210,999 B1 | 4/2001 | Gardner et al. ............. 438/183 |
| 6,229,175 B1 | 5/2001 | Uchida ........................ 257/315 |
| 6,238,976 B1 | 5/2001 | Noble et al. ................. 438/259 |
| 6,246,606 B1 | 6/2001 | Forbes et al. ........... 365/185.03 |
| 6,249,020 B1 | 6/2001 | Forbes et al. ............... 257/315 |
| 6,249,460 B1 | 6/2001 | Forbes et al. .......... 365/185.28 |
| 6,288,419 B1 | 9/2001 | Prall et al. ................... 257/213 |
| 6,306,708 B1 | 10/2001 | Peng ........................... 438/266 |
| 6,307,775 B1 | 10/2001 | Forbes et al. .......... 365/185.01 |
| 6,323,844 B1 | 11/2001 | Yeh et al. .................... 345/161 |
| 6,351,411 B1 | 2/2002 | Forbes et al. ............... 365/182 |
| 6,377,070 B1 | 4/2002 | Forbes ......................... 326/41 |
| 6,424,001 B1 | 7/2002 | Forbes et al. ............... 257/315 |
| 6,433,382 B1 | 8/2002 | Orlowski et al. ........... 257/315 |
| 6,440,801 B1 | 8/2002 | Furukawa et al. |
| 6,461,905 B1 | 10/2002 | Wang et al. |
| 6,461,931 B1 | 10/2002 | Eldridge .................... 438/398 |
| 6,475,857 B1 | 11/2002 | Kim et al. ................... 438/240 |
| 6,476,434 B1 | 11/2002 | Noble et al. |
| 6,504,207 B1 | 1/2003 | Chen et al. |
| 6,514,842 B1 | 2/2003 | Prall et al. ................... 438/593 |
| 6,521,943 B1 | 2/2003 | Mine et al. |
| 6,541,280 B1 | 4/2003 | Kaushik et al. ................ 438/3 |
| 6,566,682 B1 | 5/2003 | Forbes |
| 6,586,797 B1 | 7/2003 | Forbes et al. ............... 257/325 |
| 6,730,575 B1 | 5/2004 | Eldridge ..................... 257/310 |
| 6,740,928 B1 | 5/2004 | Yoshii et al. |
| 6,778,441 B1 | 8/2004 | Forbes et al. |
| 6,894,944 B1 | 5/2005 | Ishibashi et al. |
| 6,903,367 B1 | 6/2005 | Forbes |
| 6,950,340 B1 | 9/2005 | Bhattacharyya |
| 6,952,032 B1 | 10/2005 | Forbes et al. |
| 6,958,937 B1 | 10/2005 | Forbes |
| 6,963,103 B1 | 11/2005 | Forbes |
| 7,027,328 B1 | 4/2006 | Forbes et al. |
| 2001/0013621 A1 | 8/2001 | Nakazato .................... 257/314 |
| 2001/0041250 A1 | 11/2001 | Werkhoven et al. |
| 2001/0055838 A1 | 12/2001 | Walker et al. .............. 438/129 |
| 2002/0008324 A1 | 1/2002 | Shinkawata |
| 2002/0028541 A1 | 3/2002 | Lee et al. .................... 438/149 |
| 2002/0106536 A1 | 8/2002 | Lee et al. .................... 428/702 |
| 2002/0109138 A1 | 8/2002 | Forbes |
| 2002/0137250 A1 | 9/2002 | Nguyen et al. ............... 438/53 |
| 2002/0176293 A1 | 11/2002 | Forbes et al. |
| 2003/0043637 A1 | 3/2003 | Forbes et al. |
| 2003/0207032 A1 | 11/2003 | Ahn et al. |
| 2003/0207540 A1 | 11/2003 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0024945 A1 | 2/2005 | Forbes |
| 2005/0026349 A1 | 2/2005 | Forbes et al. |
| 2005/0169054 A1 | 8/2005 | Forbes |

OTHER PUBLICATIONS

Aarik, Jaan, et al., "Texture development in nanocrystalline hafnium dioxide thin films grown by atomic layer deposition", *Journal of Crystal Growth, 220(1–2)*, (2000), 105–113.

Afanas'ev, V., et al., "Electron energy barriers between (100)Si and ultrathin stacks of SiO2, Al2O3, and ZrO3 and ZrO2 insulators", *Applied Physics Letters, 78(20)*, (2001), pp. 3073–3075.

Arya, S., et al., "Conduction Properties of Thin Al2O3 Films", *Thin Solid Films, 91*, (1982), 363–374.

Dipert, Brian, "Flash Memory Goes Mainstream", *IEEE Spectrum, 30(10)*, (Oct. 1993), 48–52.

Eierdal, L.., et al., "Interaction of oxygen with Ni(110) studies by scanning tunneling microscopy", *Surface Science, 312*, (1994), pp. 31–53.

Eldridge, J., et al., "Analysis of Ultrathin Oxide Growth on Indium", *Thin Solid Films, 12*, (1972), pp. 447–451.

Eldridge, J., et al., "Measurement of Tunnel Current Density in a Metal–Oxide–Metal System as a Function of Oxide Thickness", *Proc. 12th Intern. Conf. on Low Temperature Physics*, (1971), 427–428.

Eldridge, J.M., et al., "The Growth of Thin PbO Layers on Lead Films", *Surface Science vol. 40*, (1973), 512–530.

Ferguson, J D., et al., "Atomic layer deposition of Al2O3 and SiO2 on BN particles using sequential surface reaction", *Applied Surface Science*, (2000), pp. 280–292.

Griener, J., "Josephson Tunneling Barriers by rf Sputter Etching in an Oxygen Plasma", *Journal of Applied Physics 42(12)*, (Nov. 1971), 5151–5155.

Greiner, J., "Oxidation of lead films by rf sputter etching in an oxygen plasma", *Journal of Applied Physics, 45(1)*, (1974), 32–37.

Grimblot, J., et al., "I. Interaction of Al films with O2 at low pressures", *J. Electro. Chem. Soc., vol. 129, No. 10*,(1982), pp. 2366–2368.

Grimblot, J., et al., "II. Oxidation of Aluminum Films", *J. Electrochem.*, *129*, (1982), pp. 2369–2372.

Gundlach, K., et al., "Logarithmic Conductivity of Al–Al2O3–Al Tunneling Junctions Produced by Plasma and by Thermal Oxidation", *Surface Science*, *27*, (1971), 125–141.

Guo, X., "High Quality Ultra–thin (1.5 nm) TiO2/Si3N4 Gate Dielectric for Deep Sub–micron CMOS Technology", *IEDM Technical Digest*, (1999), pp. 137–140.

Hodges, D. A., et al., *Analysis and Design of Digital Integrated Circuits*, McGraw–Hill Book Company, 2nd Edition,(1988), 394–396.

Hodges, D. A., *Analysis and Design of Digital Integrated Circuits, 2nd Edition*, McGraw–Hill Publishing. New York, (1988), pp. 354–357.

Hurych, Z., "Influence of Non–Uniform Thickness of Dielectric Layers on Capacitance and Tunnel Currents", *Solid–State Electronics, vol. 9*, (1966), 967–979.

Itokawa, H., "Determination of Bandgap and Energy Band Alignment for High–Dielectric–Constant Gate Insulators Using High–Resolution X–ray Photoelectron Spectroscopy", *Extended Abstracts of the 1999 International Conference on Solid State Devices and Materials*, (1999), pp. 158–159.

Kim, Yong S., et al., "Effect of rapid thermal annealing on the structure and the electrical properties of atomic–layer–deposited Ta2O5 films", *Journal of the Korean Physical Society*, (Dec. 2000), pp. 975–979.

Kim, H., "Leakage current and electrical breakdown in metal–organic chemical vapor deposited TiO2 dielectrics on silicon substrates", *Applied Phys. Lett., 69(25)*, pp. 3860–3862.

Kim, Yeong K., et al., "Novel capacitor technology for high density stand–alone and embedded DRAMs", *IEEE*, (2000), pp. 369–372.

Kubaschewski, O., et al., *Oxidation of Metals and Alloys, Second Edition*, Butterworths, London,(1962), pp. 1–3, 5,6, 8–12, 24, 36–69.

Kubaschewski, O., et al., "Oxidation of Metals and Alloys", *Butterworths, London*, (1962), 53–63.

Kukli, Kaupo, "Atomic Layer Deposition of Titanium Oxide from TiI4 and H2O2", *Chemical Vapor Deposition, 6(6)*, (2000),303–310.

Kukli, Kaupo, et al., "Atomic layer deposition of zirconium oxide from zirconium tetraiodide, water and hydrogen peroxide", *Journal of Crystal Growth*, (2001), pp. 262–272.

Kukli, K., "Development of Dielectric Properties of Niobium Oxide, Tantalum Oxide, and Aluminum Oxide Based Nanolayered Materials", *Journal of the Electrochemical Society, 148(2)*, (2001), pp. F35–F41.

Kukli, Kaupo, et al., "Real–time monitoring in atomic layer deposition of TiO2 from TiI4and H2O–H2O2", *American Chemical Society*, (2000), pp. 8122–8128.

Kwo, J., "Properties of high k gate dielectrics Gd2O3 and Y2O3 for Si", *Journal of Applied Physics, 89(7)*, (2001), pp. 3920–3927.

Lee, J., "Effect of Polysilicon Gate on the Flatband Voltage Shift and Mobility Degradation for ALD–Al2O3 Gate Dielectric", *IEDM*, (2000), pp. 645–648.

Luan, H. F., "High Quality Ta2O5 Gate Dielectrics with Tox,eq<10A", *IEDM Technical Digest. International Electron Devices Meeting*, (Dec. 5–8, 1999), 141–143.

Ma, Y., "Zirconium Oxide Based Gate Dielectrics with equivalents Oxide Thickness of LEss Than 1.0 nm and Performance of Submicron MOSFET using a Nitride Gate Replacement Process", *IEDM—Technical Digest*, (1999), pp. 149–152.

Marshalek, R., et al., "Photoresponse Characteristics of Thin–Film Nickel–Nickel Oxide–Nickel Tunneling Junctions", *IEEE Journal of Quantum Electronics, QE–19(4)*, (1983), pp. 743–754.

Masuoka, F., et al., "A 256K Flash EEPROM using Triple Polysilicon Technology", *IEEE International Solid–State Circuits Conference, Digest of Technical Papers*, (1985), 168–169.

Masuoka, F., et al., "A New Flash EEPROM Cell using Triple Polysilicon Technology", *International Electron Devices Meeting, Technical Digest*, San Francisco, CA,(1984), 464–467.

Mori, S., et al., "Reliable CVD Inter–Poly Dielectrics for Advanced E&EEPROM", *Symposium on VSLI Technology, Digest of Technical Papers*, (1985), 16–17.

Muller, H., "Electrical and Optical Properties of Sputtered In2O3 Films", *Physics Status Solidi, 27(2)*, (1968), pp. 723–731.

Paranjpe, Ajit, et al., "Atomic layer deposition of AlOx for thin film head gap applications", *Journal of the Electrochemical Society*, (Sep. 2001), pp. 465–471.

Pashley, R., et al., "Flash Memories: the best of two worlds", *IEEE Spectrum, 26(12)*, (Dec. 1989), 30–33.

Pollack, S., et al., "Tunneling Through Gaseous Oxidized Films of Al2O3", *Transactions of the Metallurgical Society of AIME, 233*, (1965), 497–501.

Qi, W., "MOSCAP and MOSFET characteristics using ZrO2 gate dielectric deposited directly on Si", *IEDM—Technical Digest*, (1999),145–148.

Robertson, J., "Band offsets of wide–band–gap oxides and implications for future electronic devices", *Journal of Vacuum Science & Technology B (Microelectronics and Nanometer Structures), 18(3)*, (May–Jun. 2000), 1785–1791.

Robertson, J., et al., "Schottky Barrier height of Tantalum oxide, barium strontium titanate, lead tilanate, and strontium bismuth tantalate", *Applied Physics Letters, vol. 74, No. 8*, (Feb. 22, 1999), 1168–1170.

Shi, Y., "Tunneling Leakage Current in Ultrathin (<4 nm) Nitride/Oxide Stack Dielectrics", *IEEE Electron Device Letters, 19(10)*, (Oct. 1998), pp. 388–390.

Simmons, J., "Generalized Formula for the Electric Tunnel Effect between Similiar Electrodes Separated by a Thin Insulating Film", *Journal of Applied Physics, 34(6)*, (1963), 1793–1803.

Smith, Ryan C., et al., "Chemical vapour deposition of the oxides of titanium, zirconium and hafnium for use as high–k materials in microelectronic devices. A carbon–free precursor for the synthesis if hafnium dioxide", *Advanced Materials for Optics and Electronics*, (2000), 105–114.

Swalin, R., "Equilibrium between Phases of Variable Composition", *Thermodynamics of Solids, 2nd Edition*, (1972), pp. 165–180.

Sze, S., "Physics of Semiconductor Devices, Second Edition", *John Wiley & Sons, New York*, (1981),553–556.

Yan, J., "Structural and electrical characterization of TiO2 grown from titanium tetrakis–isopropoxide (TTIP) and TTIP/H2O ambients", *Journal of Vacuum Science Technology B 14(3)*, (1996), pp. 1706–1711.

Zhang, H., et al., "Atomic Layer Deposition of High Dielectric Constant Nanolaminates", *Journal of The Electrochemical Society*, 148(4),(2001), F63–F66.

Han, Kwangseok, "Characteristics of P–Channel Si Nano–Crystal Memory", *IEDM Technical Digest, International Electron Devices Meeting*, (Dec. 10–13, 2000),309–312.

Inumiya, S , et al., "Conformable formation of high quality ultra–thin amorphous Ta2 O5 gate dielectrics utilizing water assisted deposition (WAD) for sub 50 nm damascene metal gate MOSFETs", *IEDM Technical Digest. International Electron Devices Meeting*, (Dec. 10–13, 2000),649–652.

Manchanda, L. , "Si–doped aluminates for high temperature metal–gate CMOS: Zr–Al–Si–O, a novel gate dielectric for low power applications", *IEDM Technical Digest. International Electron Devices Meeting*, (Dec. 10–13, 2000),23–26.

Yamaguchi, Takeshi , "Band Diagram and Carrier Conduction Mechanism in ZrO2/Zr–silicate/Si MIS Structure Febricated by Pulsed–laser–ablation Deposition", *Electron Devices Meeting, 2000. IEDM Technical Digest. International*, (2000),19–22.

GRADED COMPOSITION METAL OXIDE TUNNEL BARRIER INTERPOLY INSULATORS

CROSS REFERENCE TO RELATED APPLICATIONS

This application is a Continuation of U.S. patent application Ser. No. 10/177,096 filed on Jun. 21, 2002 and a Continuation-in-Part of U.S. patent application Ser. No. 09/943,134 filed on Aug. 30, 2001.

This application is related to the following co-pending, commonly assigned U.S. patent applications: "DRAM Cells with Repressed Memory Metal Oxide Tunnel Insulators," Ser. No. 09/945,395, "Flash Memory with Low Tunnel Barrier Interpoly Insulators," Ser. No. 09/945,507, "Dynamic Electrically Alterable Programmable Memory with Insulating Metal Oxide Interpoly Insulators," Ser. No. 09/945,498, "Field Programmable Logic Arrays with Metal Oxide and/or Low Tunnel Barrier Interpoly Insulators," Ser. No. 09/945,512, "SRAM Cells with Repressed Floating Gate Memory, Metal Oxide Tunnel Interpoly Insulators," Ser. No. 09/945,554, "Programmable Memory Address and Decode Devices with Low Tunnel Barrier Interpoly Insulators," Ser. No. 09/945,500, "Programmable Array Logic or Memory with P-Channel Devices and Asymmetrical Tunnel Barriers," Ser. No. 10/028,001, and "Atomic Layer Deposition of Metal Oxide and/or Low Tunnel Barrier Interpoly Insulators," Ser. No. 10/081,818, each of which disclosure is herein incorporated by reference.

FIELD OF THE INVENTION

The present invention relates generally to integrated circuits, and in particular to programmable array type logic and/or memory devices with graded composition metal oxide tunnel barrier interpoly insulators.

BACKGROUND OF THE INVENTION

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. Various combinations of silicon oxide and silicon nitride were tried. However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAlN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903,452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators have been described by the same inventors, formed of silicon suboxide and silicon oxycarbide in combination with an $SiO_2$ layer, to increase the tunneling probability and reduce erase time. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

However, all of these approaches relate to increasing tunneling between the floating gate and the substrate such as is employed in a conventional ETOX device and do not involve tunneling between the control gate and floating gate through an inter-poly dielectric.

Therefore, there is a need in the art to provide improved programmable array type logic and/or memory devices while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

REFERENCES

F. Masuoka et al., "A New Flash EEPROM Cell Using Triple Polysilicon Technology," *IEEE Int. Electron Devices Meeting*, San Francisco, pp. 464–67, 1984;

F. Masuoka et al., "256K Flash EEPROM Using Triple Polysilicon Technology," *IEEE Solid-State Circuits Conf.*, Philadelphia, pp. 168–169, 1985);

S. Mori et al., "Reliable CVD Inter-Poly Dialectics For Advanced E&EEPROM," *Symp. On VLSI Technology*, Kobe, Japan, pp. 16–17, 1985);

U.S. Pat. No. 4,780,424, "Process For Fabricating Electrically Alterable Floating Gate Memory Devices;";

B. Dipert and L. Hebert, "Flash Memory Goes Mainstream," *IEEE Spectrum*, pp. 48–51, October, 1993;

R. D. Pashley and S. K. Lai, "Flash Memories, The Best of Two Worlds," *IEEE Spectrum*, pp. 30–33, December 1989;

U.S. Pat. No. 5,801,401, "Flash Memory With Microcrystalline Silicon Carbide As The Floating Gate Structure;"

U.S. Pat. No. 5,852,306,"Flash Memory With Nanocrystalline Silicon Film As The Floating Gate;"

U.S. application Ser. No. 08/908,098, "Dynamic Random Access Memory Operation Of A Flash Memory Device With Charge Storage On A Low Electron Affinity GaN Or GaAIN Floating Gate;"

U.S. application Ser. No. 08/903,452, "Variable Electron Affinity Diamond-Like Compounds For Gates In Silicon CMOS Memories And Imaging Devices;"

U.S. Pat. No. 5,981,350, "DRAM Cells With A Structure Surface Using A Self Structured Mask;"

U.S. Pat. No. 6,025,627 "Atomic Layer Epitaxy Gate Insulators and Textured Surfaces for Low Voltage Flash Memories;"

U.S. application Ser. No. 08/903,453, "Gate Insulator For Silicon Integrated Circuit Technology By The Carburization of Silicon;"

U.S. application Ser. No. 09/945,514, "Graded Composition Gate Insulators to Reduce Tunneling Barriers In Flash Memory Devices;"

U.S. Pat. No. 6,135,175, "Memory Address Decode Array With Vertical Transistors;"

U.S. Pat. No. 5,691,230, "Technique for Producing Small Islands of Silicon on Insulator;"

U.S. application Ser. No. 09/780,169, "Flash Memory with Ultrathin Vertical Body Transistors;"

U.S. application Ser. No. 09/945,507, "Flash Memory Devices With Metal Oxide and/or Low Tunnel Barrier Interpoly Insulators;"

U.S. application Ser. No. 09/945,500, "Programmable Memory Address and Decode Devices With Metal Oxide and/or Low Tunnel Barrier Interpoly Insulators;"

U.S. application Ser. No. 09/945,512, "Field Programmable Logic Arrays With Metal Oxide and/or Low Tunnel Barrier Interpoly Insulators;"

U.S. application Ser. No. 09/945,498, "DEAPROM With Insulating Metal Oxide Interpoly Insulators;"

U.S. application Ser. No. 09/943,134, "Programmable Array Type Logic and/or Memory Devices with Metal Oxide and/or Low Asymmetrical Tunnel Barrier Interpoly Insulators;"

U.S. application Ser. No. 10/028,001, "Programmable Array Type Logic or Memory With P-Channel Devices and Asymmetrical Tunnel Barriers;"

S. R. Pollack and C. E. Morris, "Tunneling Through Gaseous Oxidized Films of $Al_2O_3$," *Trans. AIME*. Vol. 233, p. 497, 1965;

Shi, Y. et al., "Tunneling Leakage Current in Ultrathin (<4 nm) Nitride/Oxide Stack Dielectrics," *IEEE Electron Device Letters*, vol. 19. no. 10, pp. 388–390, 1998;

R. C. Smith et al, "Chemical Vapor Deposition of the Oxides of Titanium, Zirconium and Hafnium for Use as High-k Materials in Microelectronic Devices. A Carbon-free Precursor for the Synthesis of Hafnium Dioxide," *Adv. Mater. Opt., Electon.*, Vol. 10, 105–114 (2000);

K. Kukli et al, "Development of Dielectric Properties of Niobium Oxide, Tantalum Oxide and Aluminum Oxide Based Nanolayer Materials," *J. Electrochecm. Soc.* Vol. 148 (2), F35-F41 (2001);

J. D. Ferguson et al., "Atomic layer deposition of $Al_2O_3$ and $SiO_2$ on BN particles using sequential surface reactions," *Appl. Sur. Sci.* Vol. 162–163, 280–293 (2000);

H. Zhang et al, "Atomic Layer Deposition of High Dielectric Constant Nanolaminates," *J. Electrochem. Soc.* Vol. 148 (4), F63–F66 (2001).

SUMMARY OF THE INVENTION

The above mentioned problems with programmable array type logic and/or memory devices and other problems are addressed by the present invention and will be understood by reading and studying the following specification. Systems and methods are provided for programmable array type logic and/or memory devices with graded composition metal oxide tunnel barrier interpoly insulators.

In one embodiment of the present invention, a non-volatile memory cell, or floating gate transistor, includes a first source/drain region and a second source/drain region separated by a channel region in a substrate. A floating gate opposes the channel region and is separated therefrom by a gate oxide. A control gate opposes the floating gate and is separated from the floating gate by a compositionally graded mixed metal oxide tunnel barrier intergate insulator. In one embodiment, the intergate insulator is produced by low temperature chemical vapor deposition using a mixture of $TiO_2$—$ZrO_2$. In another embodiment, the intergate insulator is produced by low temperature chemical vapor deposition using a mixture of $TiO_2$—$HfO_2$. In another embodiment, the intergate insulator is produced by low temperature chemical vapor deposition using a mixture of $ZrO_2$—$HfO_2$. In another embodiment, the intergate insulator is produced by low temperature chemical vapor deposition using a mixture of $TiO_2$—$ZrO_2$—$HfO_2$. In another embodiment, intergate insulator is produced by a sequential atomic layer deposition process to make a graded $Al_2O_3$—$SiO_2$ mixed oxide barrier oxide. Here, the sequential atomic layer deposition produces a larger number of alumina mono-layers, interspersed with a lesser number of silica mono-layers, in the region nearest to the floating gate. In another embodiment, the intergate insulator is produced by oxidation of metal alloy films containing transition metals.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 2:
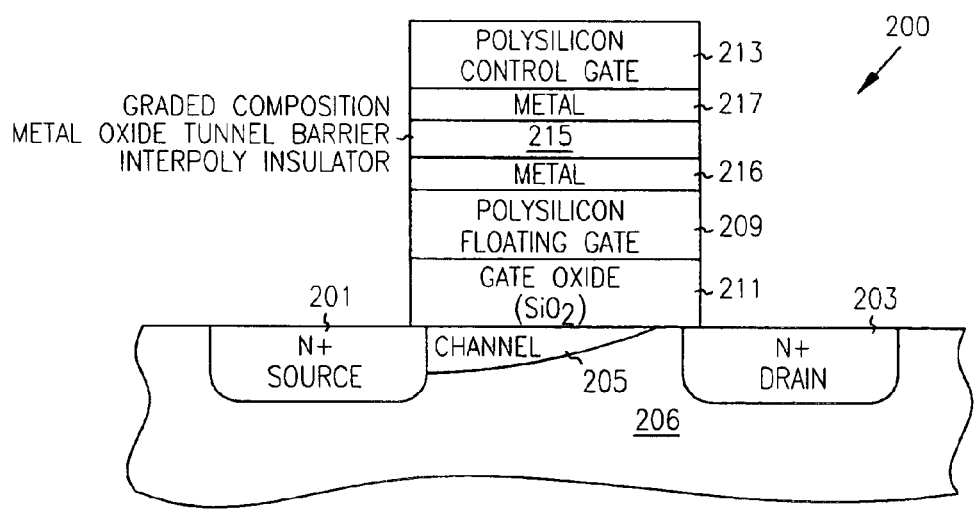
FIG. 2 illustrates one embodiment of a floating gate transistor, or non-volatile memory cell, according to the teachings of the present invention.

The present invention, describes the use of graded composition metal oxide inter-poly dielectric insulators between the control gate and the floating gate of non-volatile memory cells. An example is shown in FIG. 2 for a planar structure, or horizontal non-volatile memory cell. This non-volatile memory cell, as described herein, can then be implemented in a number of programmable array type logic and/or memory devices according to the teachings of the present invention.

According to the teachings of the present invention. The use of a graded composition metal oxide films for this purpose offer a number of advantages including:

(i) Flexibility in selecting a range of smooth metal film surfaces and compositions that can be oxidized to form tunnel barrier insulators.

(ii) Employing "low temperature oxidation" to oxidize metal alloy films to produce graded mixed oxide barriers of highly controlled thickness, composition, purity and uniformity, as well as employing low temperature CVD to produce the same.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by atomic layer deposition to produce a large number of mixed oxide tunnel barriers in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or non-volatile memory cell 200, according to the teachings of the present invention. As shown in FIG. 2, the non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by a graded composition metal oxide tunnel barrier intergate insulator 215.

In one embodiment of the present invention, the graded composition metal oxide tunnel barrier intergate insulator 215 includes a graded composition metal oxide insulator which is produced by low temperature chemical vapor deposition using a mixture of $TiO_2$—$ZrO_2$. In another embodiment, the graded composition metal oxide tunnel barrier intergate insulator 215 includes a graded composition metal oxide insulator which is produced by low temperature chemical vapor deposition using a mixture of $TiO_2$—$HfO_2$. In another embodiment, the graded composition metal oxide tunnel barrier intergate insulator 215 includes a graded composition metal oxide insulator which is produced by low temperature chemical vapor deposition using a mixture of $ZrO_2$—$HfO_2$. In another embodiment, the graded composition metal oxide tunnel barrier intergate insulator 215 includes a graded composition metal oxide insulator which is produced by low temperature chemical vapor deposition using a mixture of $TiO_2$—$ZrO_2$—$HfO_2$. In another embodiment, the graded composition metal oxide tunnel barrier intergate insulator 215 includes a graded composition metal oxide insulator which is produced by a sequential atomic layer deposition process to make a graded $Al_2O_3$—$SiO_2$ mixed oxide barrier oxide. In this embodiment, the sequential atomic layer deposition produces a larger number of alumina mono-layers, interspersed with a lesser number of silica mono-layers, in the region nearest to the floating gate. In another embodiment, the graded composition metal oxide tunnel barrier intergate insulator 215 includes a graded composition metal oxide insulator which is produced by oxidation of metal alloy films containing transition metals.

In some embodiments according to the teachings of the present invention, as shown in FIG. 2, the floating gate 209 includes a polysilicon floating gate 209 having a metal layer 216 formed thereon in contact with the graded composition metal oxide tunnel barrier intergate insulator 215. Likewise, the control gate 213 includes a polysilicon control gate 213 having a metal layer 217. In some embodiments, the metal layer 217 has a work function different from the metal layer 216 formed on the floating gate 209, formed thereon in contact with the graded composition metal oxide tunnel barrier intergate insulator 215. In one embodiment, metal layer 216 is formed of the same metal material used to form the graded composition metal oxide interpoly insulator 215. As stated above, the non-volatile memory cell, as described herein, can then be implemented in a number of programmable array type logic and/or memory devices according to the teachings of the present invention.

Figure 3:
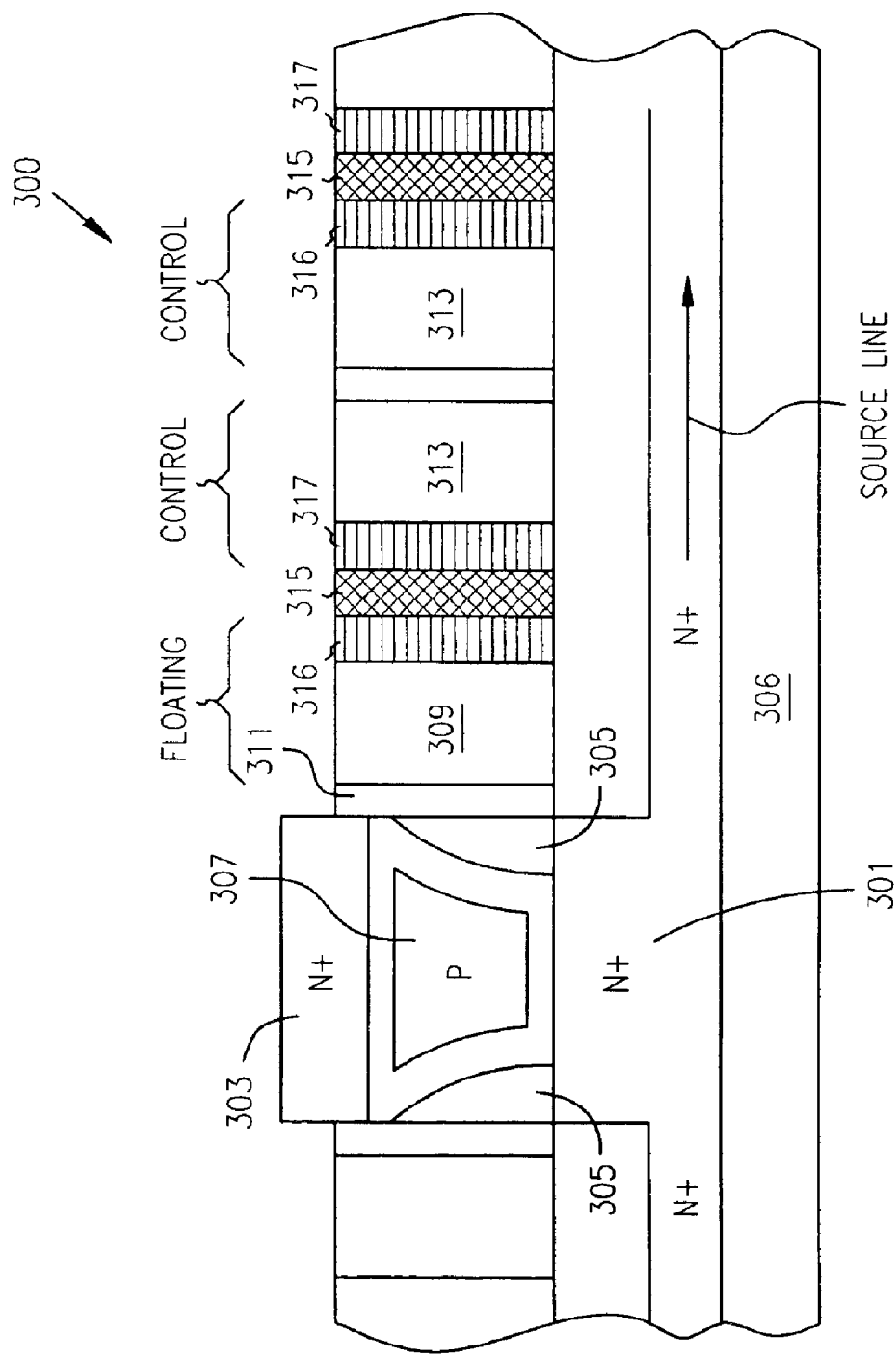
FIG. 3 illustrates another embodiment of a floating gate transistor, or non-volatile memory cell, according to the teachings of the present invention.

FIG. 3 illustrates another embodiment of a floating gate transistor, or non-volatile memory cell 300, according to the teachings of the present invention. As shown in the embodiment of FIG. 3, the non-volatile memory cell 300 includes a vertical non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. Methods for forming such a vertical transistor structure are disclosed in U.S. Pat. No. 6,135,175, entitled "Memory Address Decode Array with vertical transistors, which is incorporated herein by reference. A floating gate 309 opposes the channel region 305 and is separated therefrom by a gate oxide 311. A control gate 313 opposes the floating gate 309. According to the teachings of the present invention, the control gate 313 is separated from the floating gate 309 by a graded composition metal oxide tunnel barrier intergate insulator 315.

In one embodiment of the present invention, the graded composition metal oxide tunnel barrier intergate insulator 315 includes a graded composition metal oxide insulator which is produced by low temperature chemical vapor deposition using a mixture of $TiO_2$—$ZrO_2$. In another embodiment, the graded composition metal oxide tunnel barrier intergate insulator 315 includes a graded composition metal oxide insulator which is produced by low temperature chemical vapor deposition using a mixture of $TiO_2$—$HfO_2$. In another embodiment, the graded composition metal oxide tunnel barrier intergate insulator 315 includes a graded composition metal oxide insulator which is produced by low temperature chemical vapor deposition using a mixture of $ZrO_2$—$HfO_2$. In another embodiment, the graded composition metal oxide tunnel barrier intergate insulator 315 includes a graded composition metal oxide insulator which is produced by low temperature chemical vapor deposition using a mixture of $TiO_2$—$ZrO_2$—$HfO_2$. In another embodiment, the graded composition metal oxide tunnel barrier intergate insulator 315 includes a graded composition metal oxide insulator which is produced by a sequential atomic layer deposition process to make a graded $Al_2O_3$—$SiO_2$ mixed oxide barrier oxide. In this embodiment, the sequential atomic layer deposition produces a larger number of alumina mono-layers, interspersed with a lesser number of silica mono-layers, in the region nearest to the floating gate. In another embodiment, the graded composition metal oxide tunnel barrier intergate insulator 315 includes a graded composition metal oxide insulator which is produced by oxidation of metal alloy films containing transition metals.

In some embodiments, as shown in FIG. 3, the floating gate 309 includes a polysilicon floating gate 309 having a metal layer 316 formed thereon in contact with the graded composition metal oxide tunnel barrier intergate insulator 315. In some embodiments, the control gate 313 includes a polysilicon control gate 313 having a metal layer 317. In some embodiments, the metal layer 317 has a work function different from the metal layer 316 formed on the floating gate 309, formed thereon in contact with the graded composition metal oxide tunnel barrier intergate insulator 315. As stated above, the non-volatile memory cell, as described herein, can then be implemented in a number of programmable array type logic and/or memory devices according to the teachings of the present invention.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309. According to the teachings of the present invention, the control gate 313 is separated from the floating gate 309 by a graded composition metal oxide tunnel barrier intergate insulator 315.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
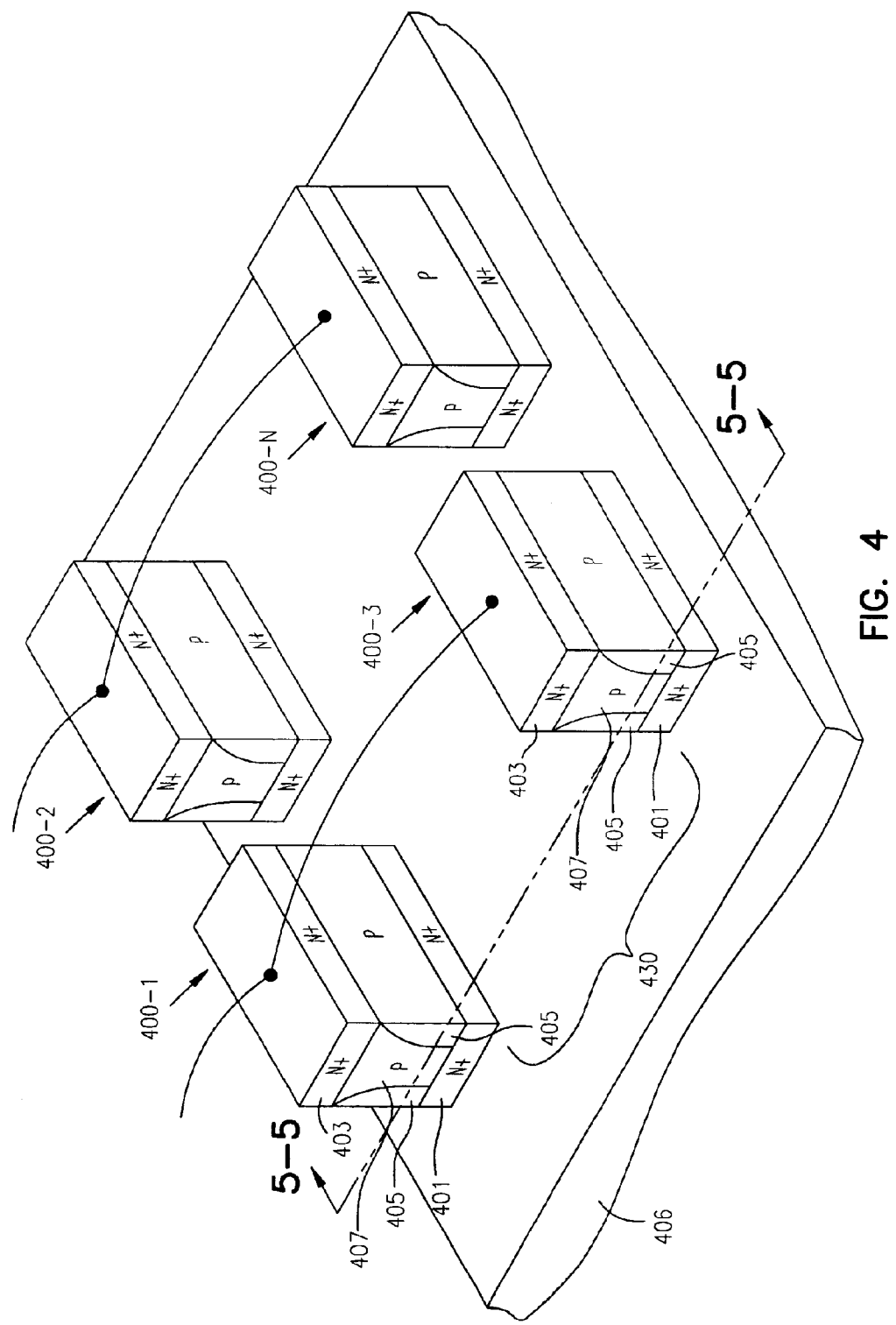
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator utilizing techniques such as described in more detail in U.S. Pat. No. 5,691,230, by Leonard Forbes, entitled "Technique for Producing Small Islands of Silicon on Insulator," issued Nov. 25, 1997, which is incorporated herein by reference.

As shown in FIG. 4, each pillar in the array of silicon pillars 400-1, 400-2, 400-3, . . . , 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, . . . , 400-N. Trenches 430 are referenced in connection with the discussion which follows in connection with FIGS. 5A–5E.

Figure 5A:
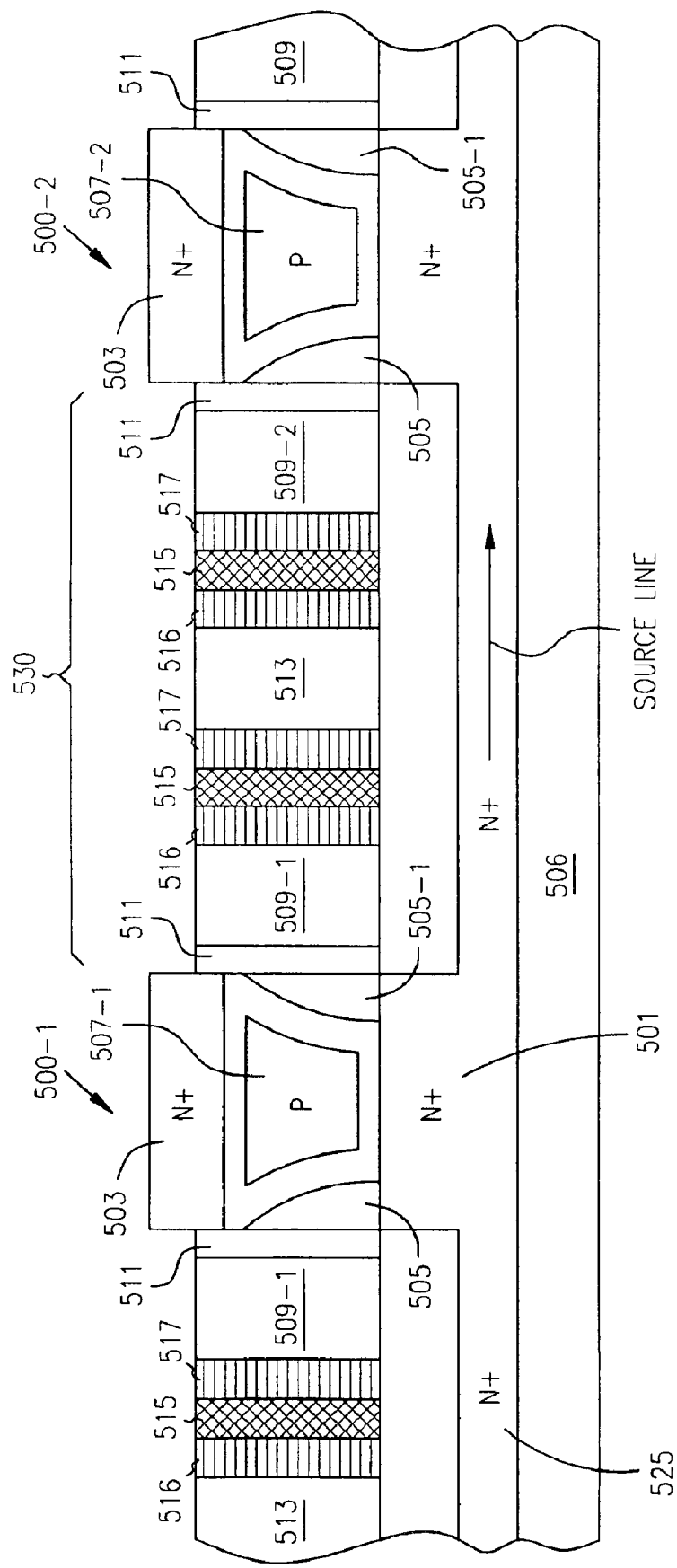
FIGS. 5A–5E are cross sectional views taken along cut line 5—5 from FIG. 4 illustrating a number of floating gate and control gate configurations which are included in the scope of the present invention.

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one of ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
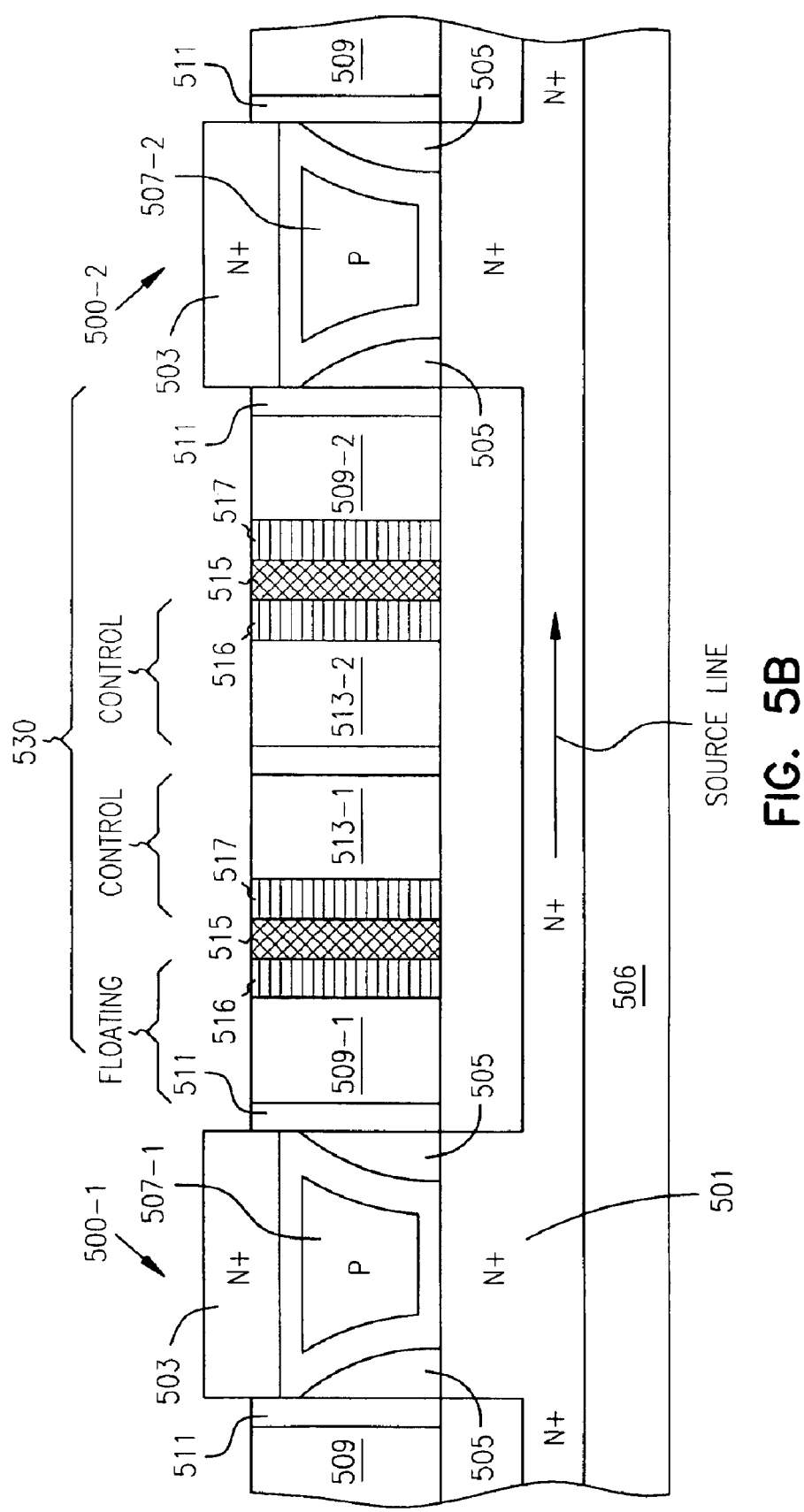

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 addresses the floating gates, 509-1 and 509-2 respectively, on opposing sides of the trench 530. In this embodiment, the pair of control gate lines, or control gates 513-1 and 513-2 are separated by an insulator layer.

Figure 5C:
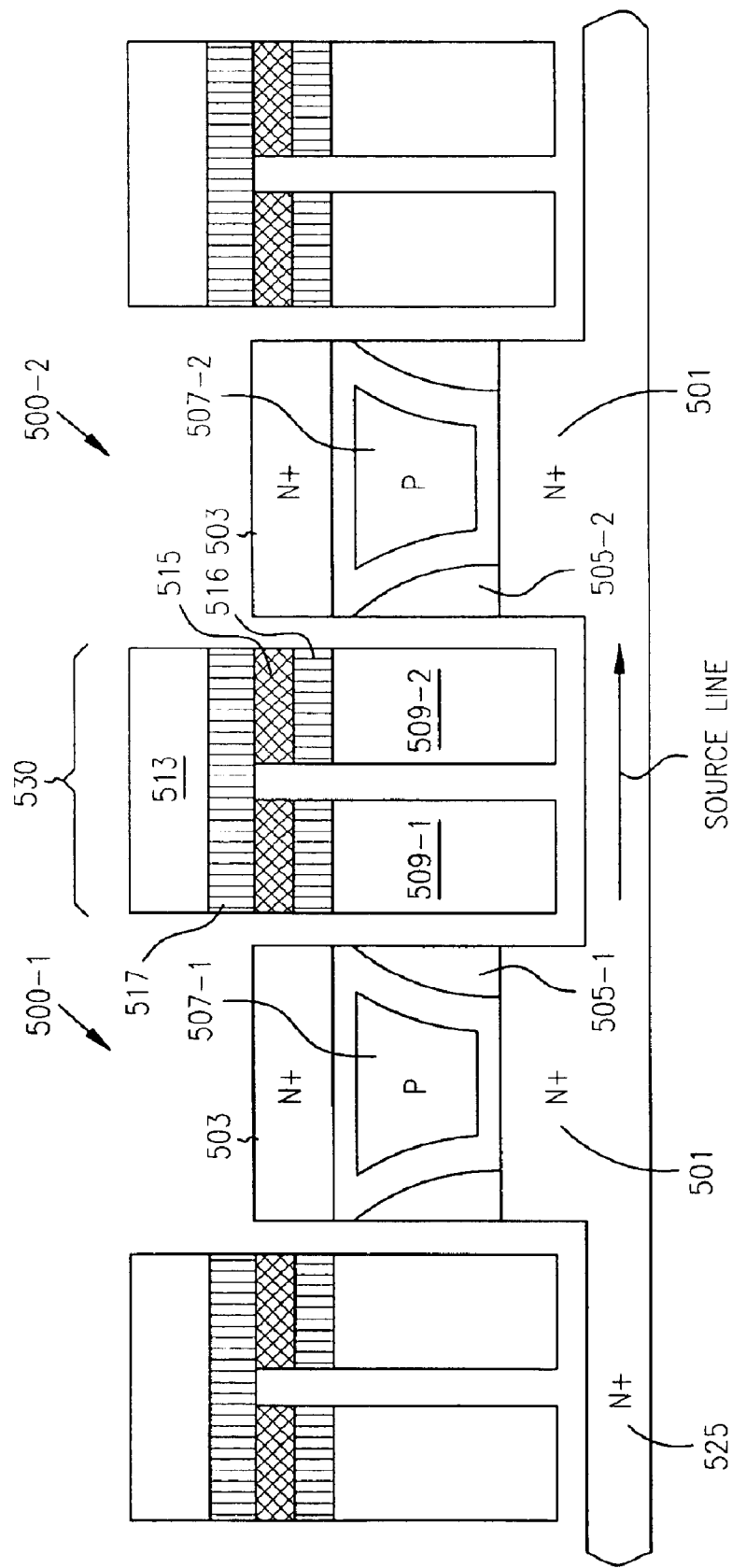

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
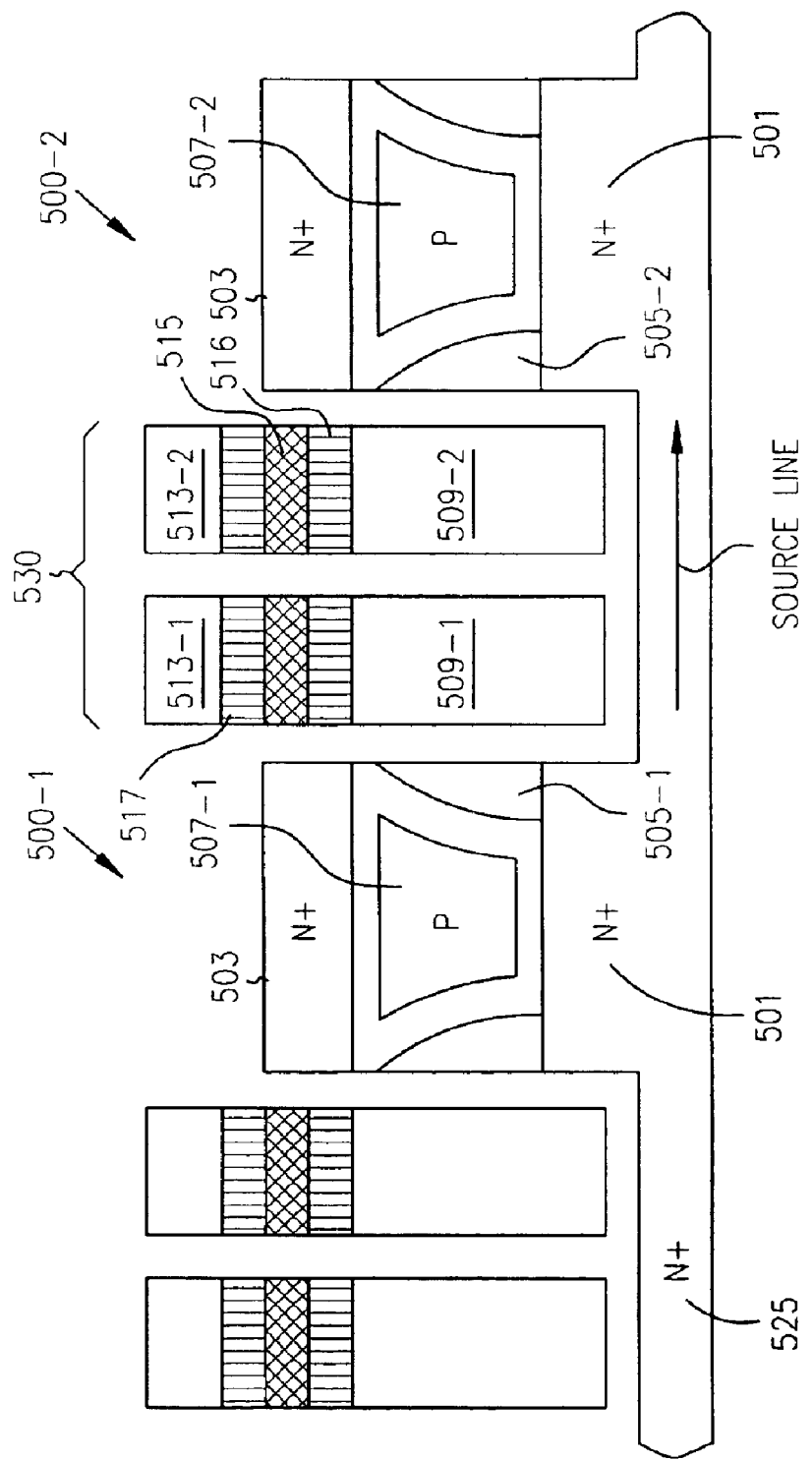

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
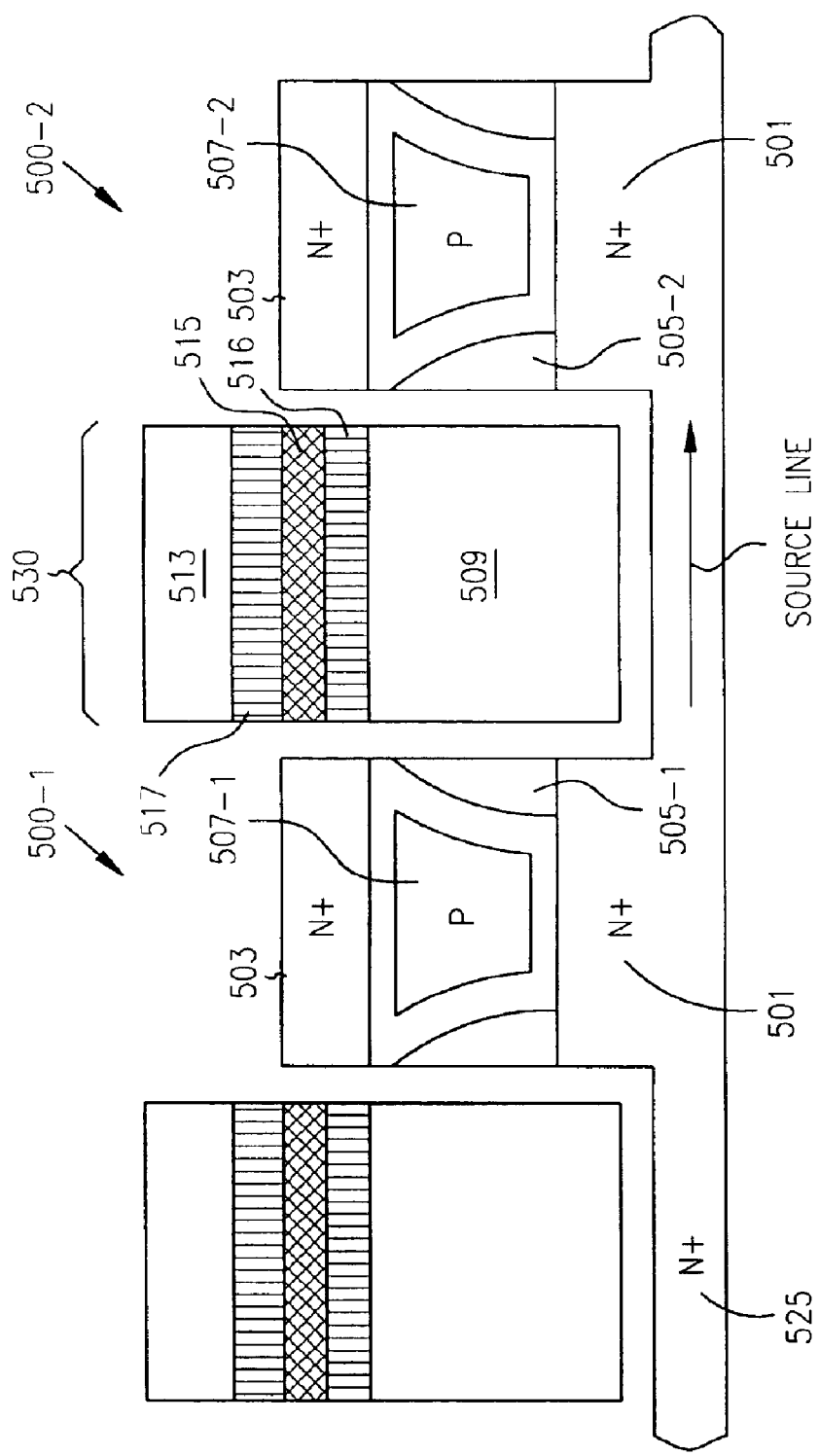

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780,169. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. In one embodiment, the control gate 513 includes a horizontally oriented control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with a graded composition metal oxide tunnel barrier intergate insulator in accordance with the descriptions given above in connection with FIG. 3. The modifications here are to use tunneling through the interpoly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
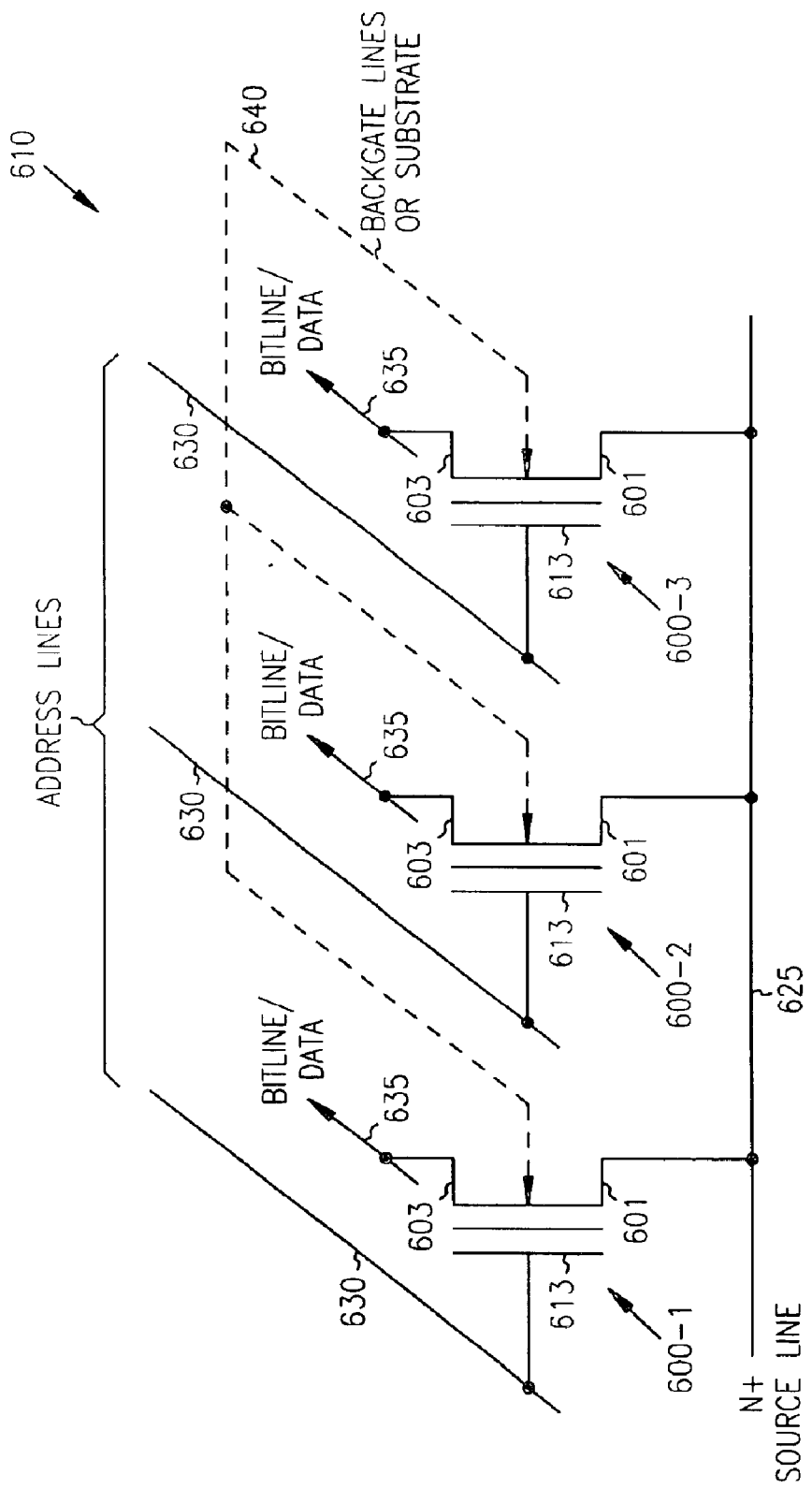
FIGS. 6A–6D illustrate a number of address coincidence schemes can be used together with the present invention.

FIGS. 6A–6D illustrate that a number of address coincidence schemes can be used together with the present invention. FIG. 6A illustrates a NOR flash memory array 610 having a number of non-volatile memory cells 600-1, 600-2, 600-3, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Figure 6B:
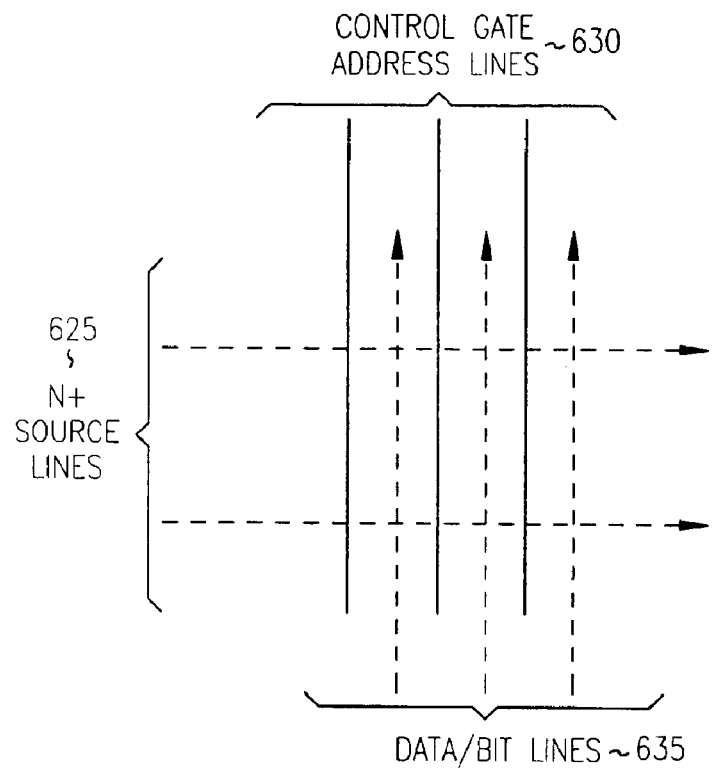
Figure 6C:
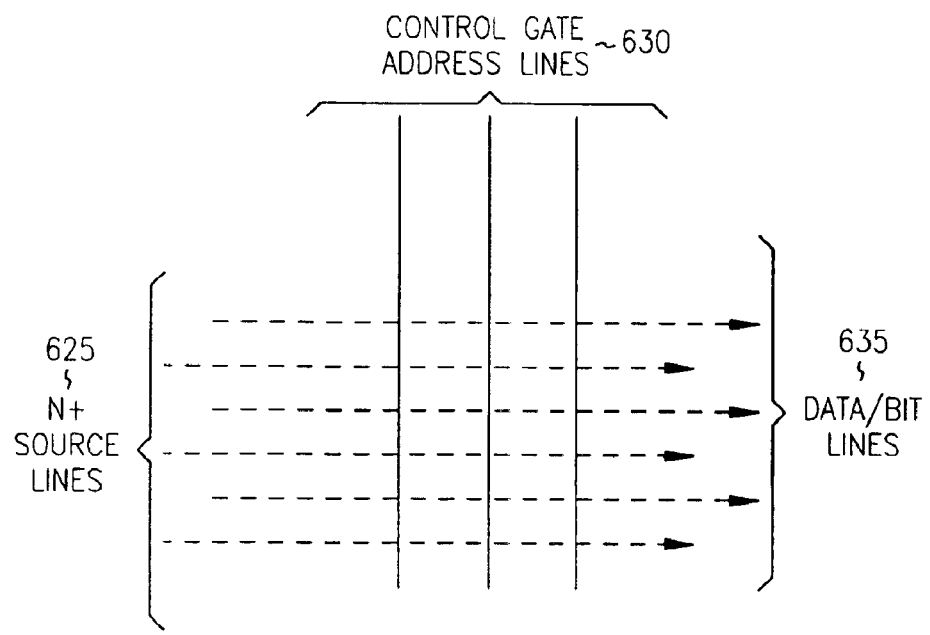
Figure 6D:
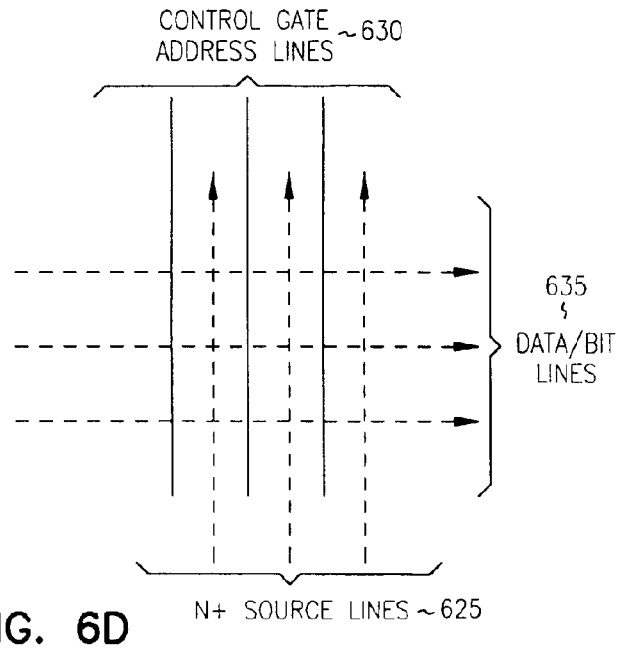

Using FIG. 6A as a reference point, FIGS. 6B–6D illustrate of top view for three different coincidence address scheme layouts suitable for use with the present invention. First, FIG. 6B provides the top view layout of the coincidence address scheme described in connection with FIG. 6A. That is, FIG. 6B illustrates a number of sourcelines 625 oriented in a first selected direction, a number of control gate lines 630 oriented in a second selected direction, and a number of bitlines 635 oriented in a third selected direction for the flash memory array 600. As explained above in connection with FIG. 6A, in this embodiment, the second and third selected direction are parallel to one another and orthogonal to the first selected direction such that the number of control gate lines 630 serve as address lines.

FIG. 6C provides the top view layout of another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the third selected direction are parallel to one another and orthogonal to the second selected direction. In this embodiment, the number of control gate lines 630 again serve as address lines.

FIG. 6D provides the top view layout of yet another coincidence address scheme according to the teachings of the present invention. This is, FIG. 6D illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6D, the first selected direction and the second selected direction are parallel to one another and orthogonal to the third selected direction. In this embodiment, the number of bitlines 635 serve as address lines.

As will be apparent to one of ordinary skill in the art upon reading this disclosure, and as will be described in more detail below, write can still be achieved by hot electron injection and/or, according to the teachings of the present invention, tunneling from the control gate to the floating gate. According to the teachings of the present invention, block erase is accomplished by driving the control gates with a relatively large positive voltage and tunneling from the metal on top of the floating gate to the metal on the bottom of the control gate.

Figure 7A:
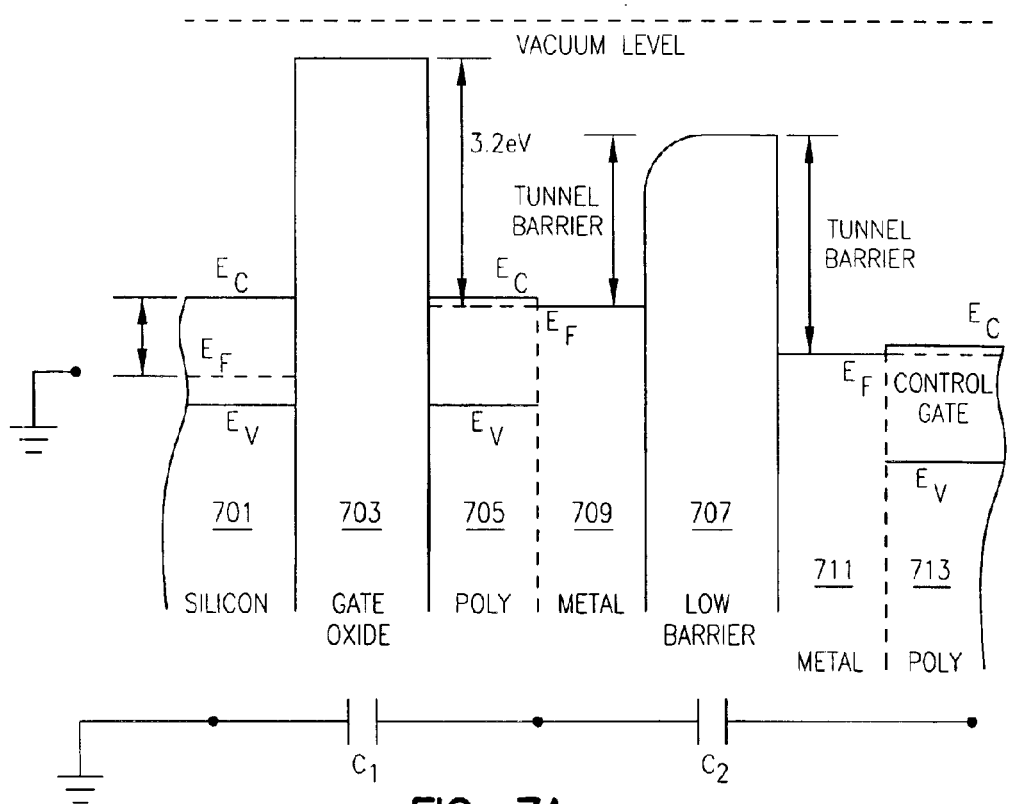
FIG. 7A is an energy band diagram illustrating the band structure at vacuum level with the low tunnel barrier inter-poly insulator according to the teachings of the present invention.

FIG. 7A is an energy band diagram illustrating the band structure at vacuum level with the graded composition metal oxide tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the graded composition metal oxide tunnel barriers, formed by low temperature CVD, by low temperature oxidation of metal alloy films, and by atomic layer deposition (ALD), as used in the present invention for easy erase. Erase is achieved by the use of positive control gate voltages through the low tunnel barrier. In one embodiment, according to the teachings of the present invention, read utilizes positive control gate voltages with n-channel enhancement mode devices as described in the above referenced, copending applications, by the same inventors, entitled "FLASH MEMORY DEVICES WITH METAL OXIDE AND/OR LOW TUNNEL BARRIER INTERPLOY INSULATORS," application Ser. No. 09/945,507, "PROGRAMMABLE MEMORY ADDRESS AND DECODE DEVICES WITH METAL OXIDE AND/OR LOW TUNNEL BARRIER INTERPLOY INSULATORS," application Ser. No. 09/945,500, "FIELD PROGRAMMABLE LOGIC ARRAYS WITH METAL OXIDE AND/OR LOW TUNNEL BARRIER INTERPLOY INSULATORS, application Ser. No. 09/945,512, "DEAPROM WITH INSULATING METAL OXIDE INTERPLOY INSULATORS," application Ser. No. 09/945,498. In another embodiment, according to the teachings of the present invention, read utilizes negative control gate voltages with n-channel depletion mode devices as described in the above referenced, copending application, by the same inventors, entitled "PROGRAMMABLE ARRAY TYPE LOGIC AND/OR MEMORY DEVICES WITH METAL OXIDE AND/OR LOW ASYMMETRICAL TUNNEL BARRIER INTERPLOY INSULATORS," application Ser. No. 09/943,134. In another embodiment, according to the teachings of the present invention, read utilizes negative control gate voltages with p-channel enhancement mode devices as described in the above referenced, copending application, by the same inventors, entitled "PROGRAMMABLE ARRAY TYPE LOGIC OR MEMORY WITH P-CHANNEL DEVICES AND ASYMMETRICAL TUNNEL BARRIERS," application Ser. No. 10/028,001. Each of which above references is incorporated herein in full by reference for all purposes. Programming is accomplished by channel hot electron injection with n-channel devices and/or electron injection from the control gate for both n-channel and p-channel devices and may or may not utilize positive substrate, well, or body bias.

Figure 7B:
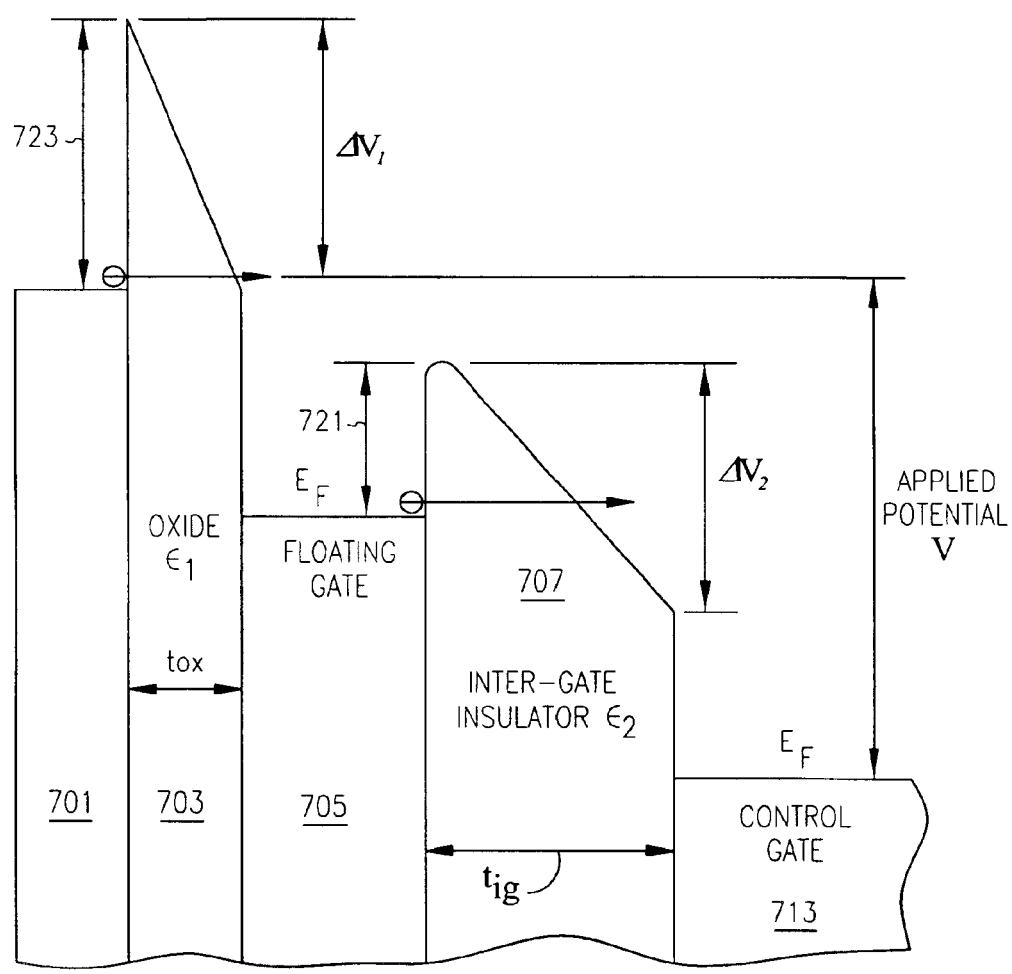
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the graded composition metal oxide tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure according to the teachings of the present invention.

As shown in FIG. 7B, the electric field is determined by the total voltage difference across the structure, the ratio of the capacitances (see FIG. 7A), and the thickness of the graded composition interpoly dielectric 707.

$$t_{ig} = \frac{\epsilon_2 \, tox}{\epsilon_1}$$

The voltage across the graded composition interpoly dielectric 707 will be, $\Delta V2 = V \, C1/(C1+C2)$, where V is the total applied voltage. The capacitances, C, of the structures depends on the dielectric constant, $\epsilon_r$, the permittivity of free space, $\epsilon_o$, and the thickness of the insulating layers, t, and area, A, such that $C=\epsilon_r\epsilon_o A/t$, Farads/cm$^2$, where $\epsilon_r$ is the low frequency dielectric constant. The electric field across the graded composition interpoly dielectric insulator 707, having capacitance, C2, will then be $E2=\Delta V2/t2$, where t2 is the thickness of this layer. The tunneling current in erasing charge from the floating gate 705 by tunneling to the control gate 713 will then be as shown in FIG. 7B given by an equation of the form:

$$J = B \exp(-Eo/E)$$

$$J = \frac{q^2 E^2}{4\pi h \Phi} e^{-Eo/E} \quad E_o = \frac{8\pi}{3} \frac{\sqrt{2mq\Phi^{3/2}}}{h}$$

where E is the electric field across the interpoly dielectric insulator 707 and Eo depends on the barrier height. Practical values of current densities for aluminum oxide which has a current density of 1 A/cm$^2$ at a field of about $E=1$ V/20 Å$=5\times10^{+6}$ V/cm are evidenced in a description by Pollack. Practical current densities for silicon oxide transistor gate insulators which has a current density of 1 A/cm$^2$ at a field of about $E=2.3V/23$ Å$=1\times10^{+7}$ V/cm are evidenced in a description by T. P. Ma et al.

The lower electric field in the aluminum oxide interpoly insulator 707 for the same current density reflects the lower tunneling barrier ($\Phi_O$) 721 of approximately 2 eV, shown in FIG. 7B, as opposed to the 3.2 eV tunneling barrier ($\Phi_O$) 723 of silicon oxide 703, also illustrated in FIG. 7B.

Figure 7C:
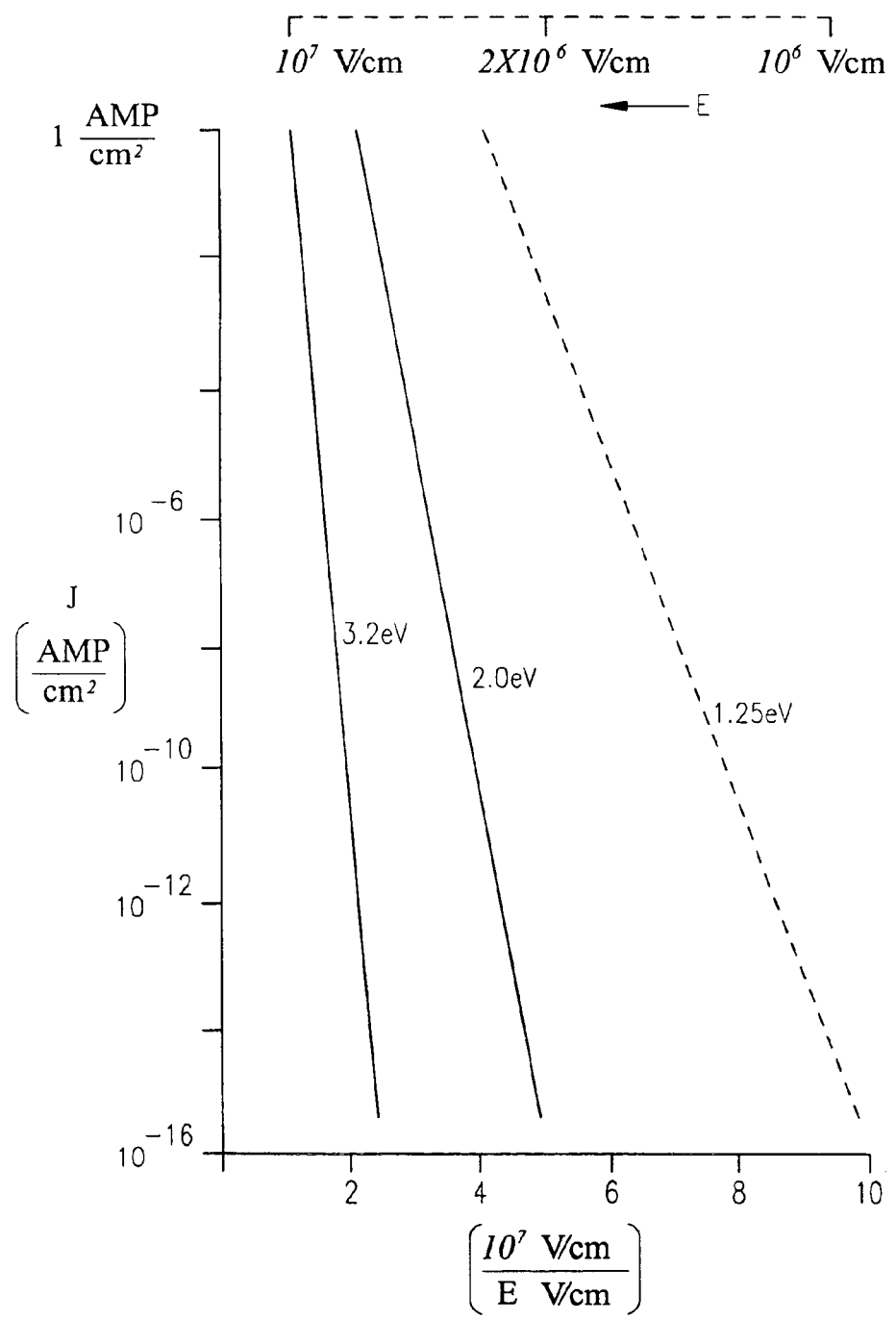
FIG. 7C is a graph plotting tunneling currents versus the applied electric fields (reciprocal applied electric field shown) for an number of barrier heights.
Figure 8:
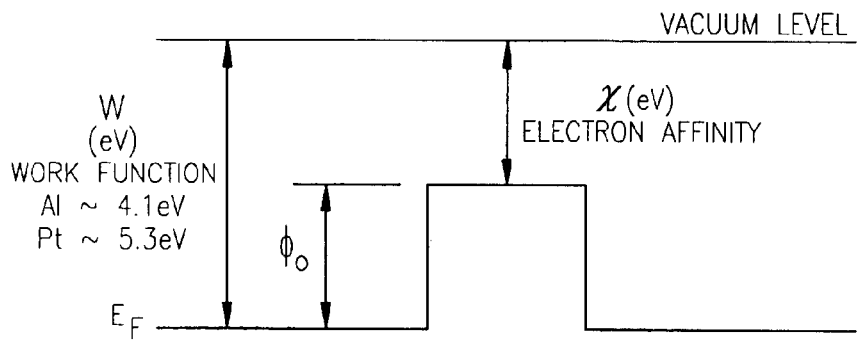
FIG. 8 illustrates an energy band diagram useful in describing the properties of an embodiment of the present invention.

FIG. 7C is a graph plotting tunneling currents versus the applied electric fields (reciprocal applied electric field shown) for a number of barrier heights. FIG. 7C illustrates the dependence of the tunneling currents on electric field (reciprocal applied electric field) and barrier height. The fraction of voltage across the graded composition interpoly or graded composition intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Methods of Formation

We disclose below several approaches for forming asymmetrical tunnel barriers comprised of two or more metal oxides which have different tunnel barrier heights when contacted by the same electrode material. The barrier asymmetry is produced by combining the component metal oxides in such a way as to produce a gradient of their respective concentrations across the thickness of the resultant mixed oxide tunnel barrier. Effects of these major compositional changes differ from those involving small departures from exact oxide stoichiometry that have been used in some of the previous disclosures referenced above. Such non-stoichiometric effects may also be present but will not be mentioned further in the following discussions which describe broad classes of approaches for forming a very broad range of asymmetrical barriers due to grading mixed oxide compositions.

As a starting point for forming a graded, mixed oxide barrier, we begin by noting that barriers for a range of metal oxides vary widely, from ~0.2 to 2.7 eV, depending on the contact metallurgy. (See TABLE A).

TABLE A

| | $E_G$ | $\epsilon_r$ | $\epsilon\infty$ | $\chi$ | $\Phi_o$ (Pt) | $\Phi_o$ (Al) |
|---|---|---|---|---|---|---|
| Conventional Insulators | | | | | | |
| SiO$_2$ | ~8 eV | 4 | 2.25 | 0.9 eV | | 3.2 eV |
| Si$_3$N$_4$ | ~5 eV | 7.5 | 3.8 | | | 2.4 eV |
| Metal Oxides | | | | | | |
| Al$_2$O$_3$ | 7.6 eV | 9–11 | 3.4 | | | ~2 eV |
| NiO | | | | | | |
| Transition Metal Oxides | | | | | | |
| Ta$_2$O$_5$ | 4.65–4.85 | | 4.8 | 3.3 | 2.0 | 0.8 eV |
| TiO$_2$ | 6.8 | 30–80 | 7.8 | 3.9 | ~1.2 eV | |
| ZrO$_2$ | 5–7.8 | 18.5–25 | 4.8 | 2.5 | | 1.4 |
| Nb$_2$O$_5$ | 3.1 | 35–50 | | | | |
| Y$_2$O$_3$ | 6 | | 4.4 | | | 2.3 |
| Gd$_2$O$_3$ | | | | | | |
| Perovskite Oxides | | | | | | |
| SrBi$_2$Ta$_2$O$_3$ | 4.1 | | 5.3 | 3.3 | 2.0 | 0.8 eV |
| SrTiO$_3$ | 3.3 | | 6.1 | 3.9 | 1.4 | 0.2 eV |
| PbTiO$_3$ | 3.4 | | 6.25 | 3.5 | 1.8 | 0.6 eV |
| PbZrO$_3$ | 3.7 | | 4.8 | | ~1.4 | 0.2 eV |

Note, for example, that the barrier heights for Pt/TiO$_2$ and Pt/Ta$_2$O$_5$ are ~1.2 and 2.0, respectively. Thus a barrier (comprised in part of TiO$_2$ and the remainder is Ta$_2$O$_5$) that is Ti-rich at the inner interface but less so at the outer will have an asymmetrical barrier that is lower at the inner and higher at the outer interface for the same (Pt) contact metal. Experimental barrier heights have not been determined for even homogeneous mixed oxide layers. However, one can estimate barrier heights by assuming that they will be intermediate between those of the component oxides. For example, a mixed oxide comprised of equal amounts of $TiO_2$ and $Ta_2O_5$ should have a barrier height near ~1.6 eV with a Pt contact. In the following sections, the present invention discloses how to form asymmetrical, mixed oxide tunnel barrier structures using a variety of oxides and practical processes. Although not discussed, it is quite clear that some of these processes can also be employed to produce graded tunnel barriers comprised of other insulating materials including oxy-nitrides, nitrides and possibly oxy-carbides and even carbides.

I. Graded Oxide Barriers by Low Temperature CVD.

Binary transition metal oxide mixtures or solid solutions formed by CVD can be used to make several graded oxide systems. For example, in an article by Smith et al. the authors there determined that thin $TiO_2$, $ZrO_2$ and $HfO_2$ films can be formed on silicon substrates, using CVD and Group IV metal anhydrous nitrate precursors at temperatures of 250–300 degrees Celsius. While the nitrate compounds provide oxygen to produce the fully-oxidized metals, interfacial films of silicon oxide form as well as during the initial stage of metal dioxide deposition. The metal oxide films contain no carbon, hydrogen or halogen but have approximately 10–20% excess oxygen. There are several approaches for making graded oxide barriers using mixtures of: $TiO_2$—$ZrO_2$; $TiO_2$—$HfO_2$; $ZrO_2$—$HfO_2$; and, $TiO_2$—$ZrO_2$—$HfO_2$. Within each group, one can tailor gradients to find those having the desired characteristics. The following examples outline how to fabricate these into structures. Processing details are omitted since they will vary, depending on materials and devices, and are obvious to one skilled in the art. However it must be emphasized that the film depositions are to be carried out on surfaces free of native oxides and contaminants. This can be done in various ways including the use of low energy ion bombardment with inert gas ions and by using systems that allow in situ cleaning, multiple depositions and other processes.

Figure 9A:
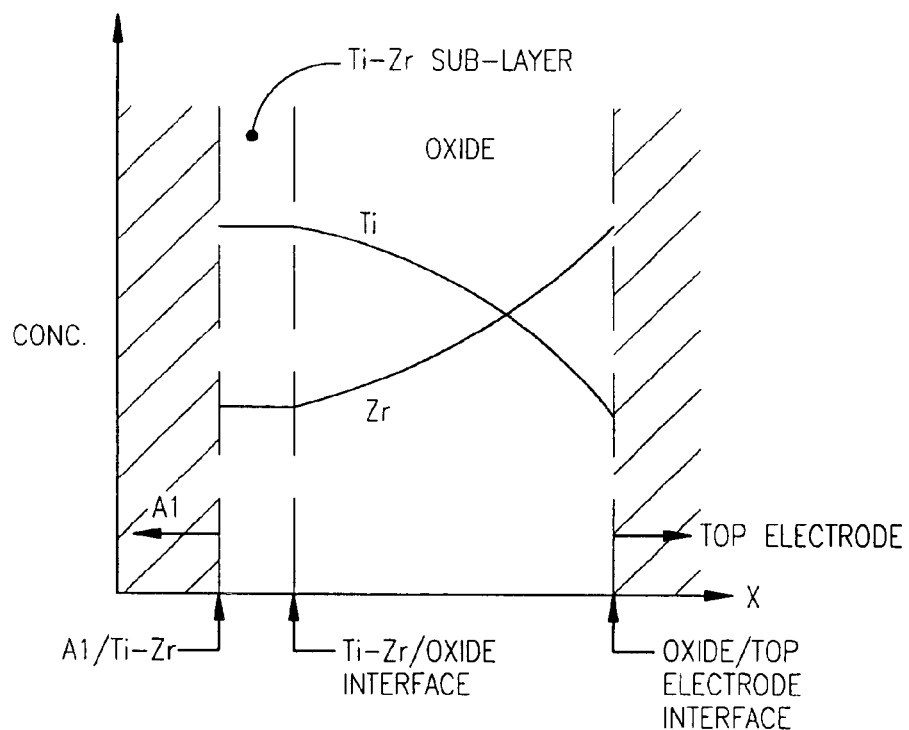
FIGS. 9A–9B illustrate different embodiments for the compositional profiles for the graded composition metal oxide tunnel barrier intergate insulators according to the teachings of the present invention.

Process A.
1. Deposit a layer of Al on the floating gate to provide a planar, conducting surface.
2. Deposit a layer of Ti—Zr alloy.
3. Deposit a $TiO_2$—$ZrO_2$ film using a modified process such as that described in the above article by Smith et al. Vary the ratio of $Ti(NO_3)_4/Zr(NO_3)_4$ reactants with time to produce: an initial oxide composition having a Ti/Zr concentration ratio close to that of the underlying alloy; and, a gradient that increases in Zr concentration with thickness. A relative concentration-distance profile is shown schematically after oxide formation in FIG. 9A. The outer barrier will be greater than the inner.
4. Vacuum anneal under conditions needed to remove unstable, excess oxygen. Treatments must be found, not being known a priori.
5. Complete the structure by adding the top electrode material such as: a Ti/Zr alloy, Al or a noble metal such as Pt or Pd, etc.

Process B.
1. Deposit a layer Al on the Si floating gate. This serves as an adhesion layer for the noble metal and prevents silicide formation.
2. Deposit Pt or Pd, e.g., to act as an oxidation barrier.
3. Deposit a graded oxide.
4. Remove the excess oxygen.
5. Add the top electrode layer. (See generally, FIG. 9A).

Process C.

1. Modify the graded mixed oxides produced above in order to stabilized their as-deposited structure and prevent unwanted crystallization and grain grown. This can be done with small additions of glass-forming elements to the anhydrous metal nitrate reactants. For silicon, this might involve using a volatile halide compound since Si does not form nitrates or nitrides.

II Graded Oxide Barriers by Oxidation of Metal Alloy Films can produce excellent tunnel barrier oxides. Manufacturing scale vacuum systems and thin film technologies have been used by IBM (beginning about 1970, a decade-long effort was carried out with IBM to develop a manufacturable technology for building super fast computers, using initially Josephson tunnel junctions formed by oxidation of Pb—In—Au films) and others to develop and qualify procedures for mass producing metal oxide tunnel devices for Josephson-based computer operations. Remarkably, 15 angstrom thick, oxide barriers can be built by oxidizing vacuum-deposited Pb—In—Au films. Such oxides are quite reproducible (to within approximately 0.2 angstroms in thickness) and have acceptably low levels of leakage. While such alloys would not be used here, the Josephson R and D activities and others as well provides an "existence theorem" demonstrating that viable manufacturing processes can be built around alloy film oxidation, even when the alloy films contain multiple phases and metals that differ greatly in their metallurgical properties, e.g., oxygen reactivities and mutual solubilities.

The present invention discloses the novel concept of forming and oxidizing graded-composition, metal alloy films for producing graded composition oxide tunnel barriers. The present invention uses for this purpose alloy films that typically contain Transition Metals (TM's) having important, common characteristics: 1) TM's mainly oxidize with a logarithmic-type time dependence, reaching self-limiting oxide thickness values (under 100 Å) in oxygen for temperatures<400 degrees Celsius. 2) The TM's are refractory with very small diffusivities at low temperatures. Thus one can make TM alloy films having concentration gradients that are stable, provided the films are not heated excessively prior to oxidation. 3) Most TM's including lanthanides and alkaline earth metal possess very high and relatively similar affinities for oxygen. 4) Most very thin TM oxides formed by oxidation at low temperatures are amorphous or virtually so. 5) Although experimental data on low temperature oxidation of TM alloys is non-existent or nearly so. However, those skilled in the art can a priori choose particular TM alloy films that will obey logarithmic-time growth dependencies, thus allowing for the production of mixed oxide layers having highly-determinable thicknesses. 6) The relative concentrations of TM's in the growing oxide will correspond to those being converted to oxide in the underlying alloy. Thus graded composition oxides can be produced reproducibly. 7) The mixed TM oxides thus produced will be amorphous or nearly so. Based upon these considerations, one can sketch several approaches for producing TM graded Oxide tunnel junctions by low temperature oxidation of graded metal alloys. Processes D to F are given as examples.

Process D.
1. Deposit an Al layer on the Si floating gate.
2. Deposit a thin layer of Pt or Pd.
3. Deposit a Ti—Zr alloy film having a Zr/Ti concentration ratio which increases with thickness. Films can be made using: co-deposition with 2 Knudsen evaporation sources having programmed to vary with film thickness; co-deposition from 2 sputter guns; possibly by physical sputtering a single target, varying sputtering parameters with time.

4. Completely oxidize the alloy to form a mixed oxide wherein the zirconia concentration increases with oxide thickness while the titania concentration falls off correspondingly.

Figure 9B:
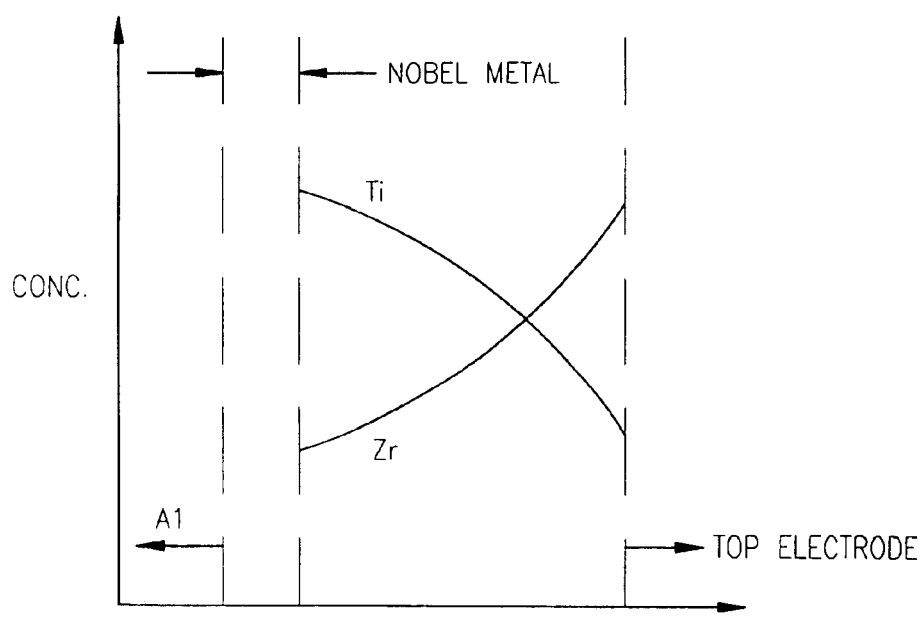

5. Complete the graded tunnel barrier by adding a top electrode material. The completed structure might look like that of FIG. 9B.

Process E.

1. Deposit a graded layer of Ti—Zr alloy on the Si floating gate. The composition can be held constant until a given to be determined (TBD) thickness is reached before introducing a gradient in the alloy film. The constant-composition region is to be sufficient as to provide: a barrier to prevent Si oxidation; and, help fix the tunnel barrier height at its interface with oxide.

2. Oxidize the graded composition portion of the alloy. Some over-oxidation can be allowed since the intent is primarily to increase the zirconia/titania ratio on going towards the surface of the mixed oxide. Note that the thermal oxidation process will produce a mixture of oxides that require no subsequent oxygen out-gassing vacuum heat treatment.

3. Add the top electrode contact.

Process F

This is similar to Processes D and E except that a small amount of silicon is added to the Ti—Zr alloy in order to promote retention of an amorphous oxide structure.

III Graded Oxide Barriers by ALD can produce a large number of mixed oxide tunnel barriers. For example, Kukli et al have formed graded mixtures of $Ta_2O_5$, $Nb_2O_5$ and $Al_2O_3$ by ALD on soda lime substrates at 300 degrees Celsius, using precursors of $Ta(OC_2H_5)_5$, $Nb(OC_2H_5)_5$ and $AlCl_3$ and well established ALD recipes. They were able to, for example, vary the refractive index of $Ta_2O_5$—$Nb_2O_5$ mixtures by making films progressively richer in $Ta_2O_5$. As another example, Ferguson et al used $SiCl_4$ and $Al(CH_3)_3$ precursors and ALD to sequentially coat BN particles at roughly 300 degrees Celsius. Thus one might fabricate graded oxide films in various ways as evident from the examples G and H below:

Process G.

Use the well-established chemistries in the references of Kukli et al to produce, for example, graded $Al_2O_3$—$Ta_2O_5$ solid solution films whose alumina concentration increases with the mixed oxide thickness. The tunnel barrier of such a mixed oxide will be greater at the outer than the inner interface, for the same contact metallurgy.

Process H.

Use nano-laminants comprised of different metal oxides. As one example, use sequential ALD processes to make a graded $Al_2O_3$—$SiO_2$ mixed oxide barrier oxide. The sequencing will be such as to produce a larger number of alumina mono-layers, interspersed with a lesser number of silica mono-layers, in the region nearest to an inner interface with the floating gate. With increasing thickness of the nano-laminate, progressively increase the number of silica layers deposited, relative to the number of alumina layers. For example, one might have a sequence such as:

F.G./$Al_2O_3$/$Al_2O_3$/$SiO_2$/$Al_2O_3$/$Al_2O_3$ . . . $SiO_2$/$SiO_2$/$Al_2O_3$/$SiO_2$/$SiO_2$/C.G.

Where F.G. and C.G. represent the Floating Gate and Control Gate contacts, respectively. In such a layered dielectric, the barrier height of the alumina-rich region will be mitigated by the close proximity of silica while the silica-rich barrier will be lowered due to the presence of alumina 2 mono-layers distant from the C.G. This makes use of the principle that tunnel barriers are determined not only by the $1^{st}$ contacting dielectric layer but also by the $2^{nd}$, $3^{rd}$, . . . $n^{th}$ layers. Clearly the relative influence on the effective tunnel barrier of a given "doping" layer will diminish rapidly with its distance from the electrode. Nevertheless one can certainly produce asymmetrical barriers in this fashion, with the ability to fine-tune the relative heights of each. It is also clear that other symmetrical tunnel barriers can be formed using other ALD oxides.

One final comment. It appears that others have not graded nano-laminants for this purpose but have focused instead on their potential for gate dielectrics and optical applications.

Method of Operation

Write can be achieved by tunneling from the control gate to the floating gate by driving the control gate negative and/or channel hot electron injection as in conventional flash memory devices. Erase would be accomplished by driving the control gates with a relatively large positive voltage and tunneling from the metal on top of the floating gate to the metal on the bottom of the control gate through the graded composition metal oxide tunnel barrier intergate insulators of the present invention. A graded composition metal oxide tunnel barrier between the floating gate and the control gate will make the erase operation easy.

In n-channel enhancement mode devices are used in the array, reading is accomplished by driving the control gate with a smaller positive voltage. If no electrons are stored on the floating gate the transistor will turn on. If electrons are stored on the floating gate the transistor will not turn on or only turn on at a lower conductivity state. This constitutes the memory function. If n-channel depletion mode devices are used in the array then reading of the stored data is accomplished with a zero or negative gate voltage, if the device conducts with zero or negative small gate voltage then there is no charge stored on the floating gate. If the floating gate is charged by stored electrons then the transistor will not conduct with zero or low negative gate voltages. The presence of stored charge on the floating gate and/or applied negative gate voltages will result in electric fields in the interpoly/intergate insulator. If the gate oxide is 2 nm (20 Å) thick then the capacitance is about $1.6 \times 10^{-6}$ F/cm$^2$ and a 1 Volt difference will store a charge of $1.6 \times 10^{-6}$ Coulombs/cm$^2$. A retention time of one second requires a leakage current of less than about $10^{-6}$ Amps/cm$^2$, if as shown in FIG. 7C the tunneling barrier is 2.0 eV and the electric field in the interpoly/intergate insulator is less than about $2 \times 10^6$ V/cm then the current density will be $10^{-16}$ Amps/cm$^2$ and the retention time $10^{+10}$ seconds. One year is about $3 \times 10^{+7}$ seconds, very long retention times can be achieved by using low electric fields during read in conjunction with the larger tunnel barrier during read.

During erase a positive voltage is applied to the control gate to tunnel electrons off of the floating gate. If in this case during erase the electric field in the interpoly/intergate insulator is about $2 \times 10^6$ V/cm and the erase barrier is as low as 1.25 eV then the erase current will be about 1 milliamp Amp/cm$^2$ and erase will be about 1 millisecond. This simple illustration serves to show that a graded composition tunneling barrier can make many orders of magnitude differences in the time for the same charge to change by tunneling even at the same electric fields. The electric field during erase can be increased if a faster erase time is required and erase easily achieved in less than a microsecond. The lower tunneling barrier results in a much faster erase at much lower electric fields and than in conventional flash memory devices which require fields of $10^7$ V/cm to achieve the erase currents of 1 Amp/cm$^2$ with a silicon oxide tunnel barrier of 3.2 eV. Thus, the graded composition tunnel barriers of the present invention can serve to make erase of flash memory type devices easy while insuring a long retention time during standby and read operations.

System Level

Figure 10:
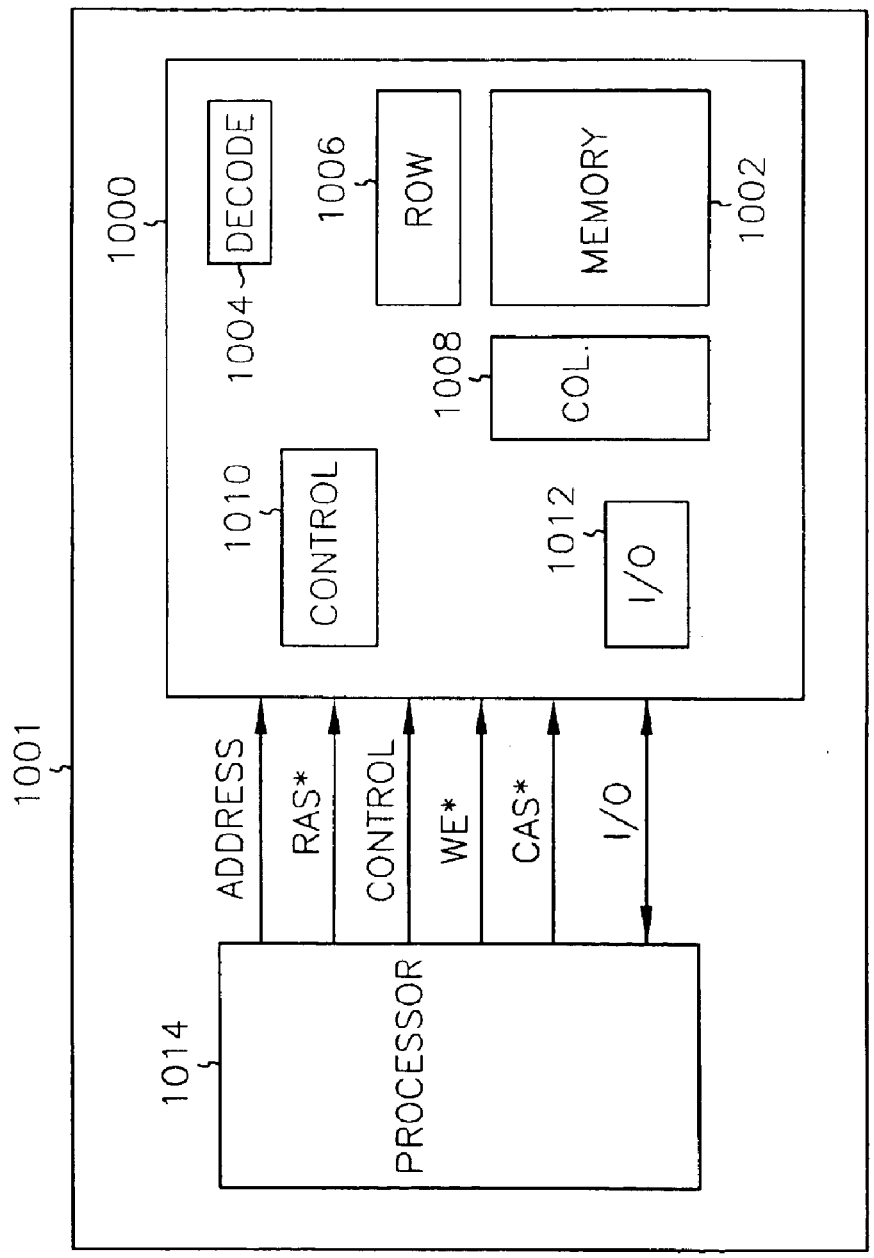
FIG. 10 illustrates a block diagram of an embodiment of an electronic system according to the teachings of the present invention.

FIG. 10 illustrates a block diagram of an embodiment of an electronic system 1001 according to the teachings of the present invention. In the embodiment shown in FIG. 10, the system 1001 includes a memory device 1000 which has an array of memory cells 1002, address decoder 1004, row access circuitry 1006, column access circuitry 1008, control circuitry 1010, and input/output circuit 1012. Also, as shown in FIG. 10, the circuit 1001 includes a processor 1014, or memory controller for memory accessing. The memory device 1000 receives control signals from the processor 1014, such as WE*, RAS* and CAS* signals over wiring or metallization lines. The memory device 1000 is used to store data which is accessed via I/O lines. It will be appreciated by those skilled in the art that additional circuitry and control signals can be provided, and that the memory device 1000 has been simplified to help focus on the invention. At least one of the processor 1014 or memory device 1000 has a memory cell formed according to the embodiments of the present invention. That is, at least one of the processor 1014 or memory device 1000 includes a graded composition metal oxide tunnel barrier interpoly insulator according to the teachings of the present invention.

It will be understood that the embodiment shown in FIG. 10 illustrates an embodiment for electronic system circuitry in which the novel memory cells of the present invention are used. The illustration of system 1001, as shown in FIG. 10, is intended to provide a general understanding of one application for the structure and circuitry of the present invention, and is not intended to serve as a complete description of all the elements and features of an electronic system using the novel memory cell structures. Further, the invention is equally applicable to any size and type of memory device 1000 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 1A:
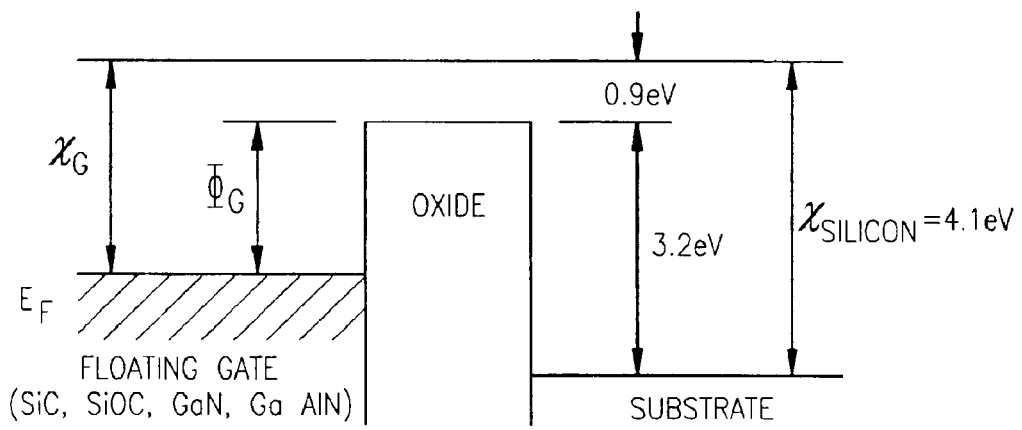
FIGS. 1A–1C illustrate a number of previous methods for reducing tunneling barriers in Flash memory.
Figure 1B:
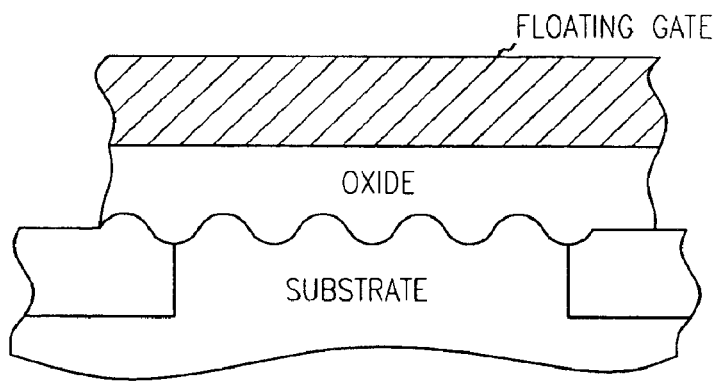
Figure 1C:
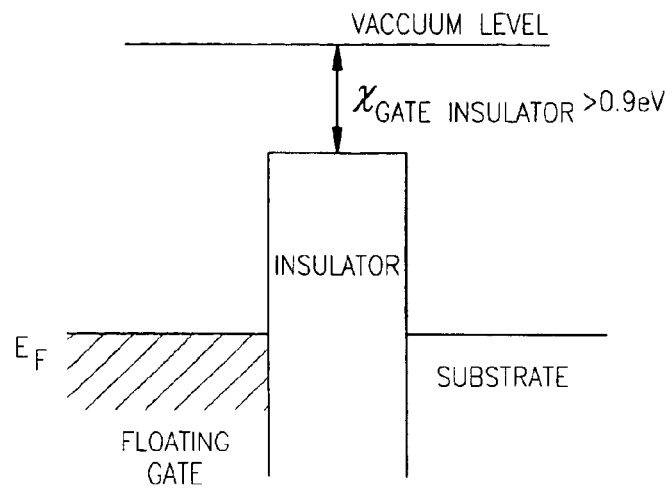
Figure 11:
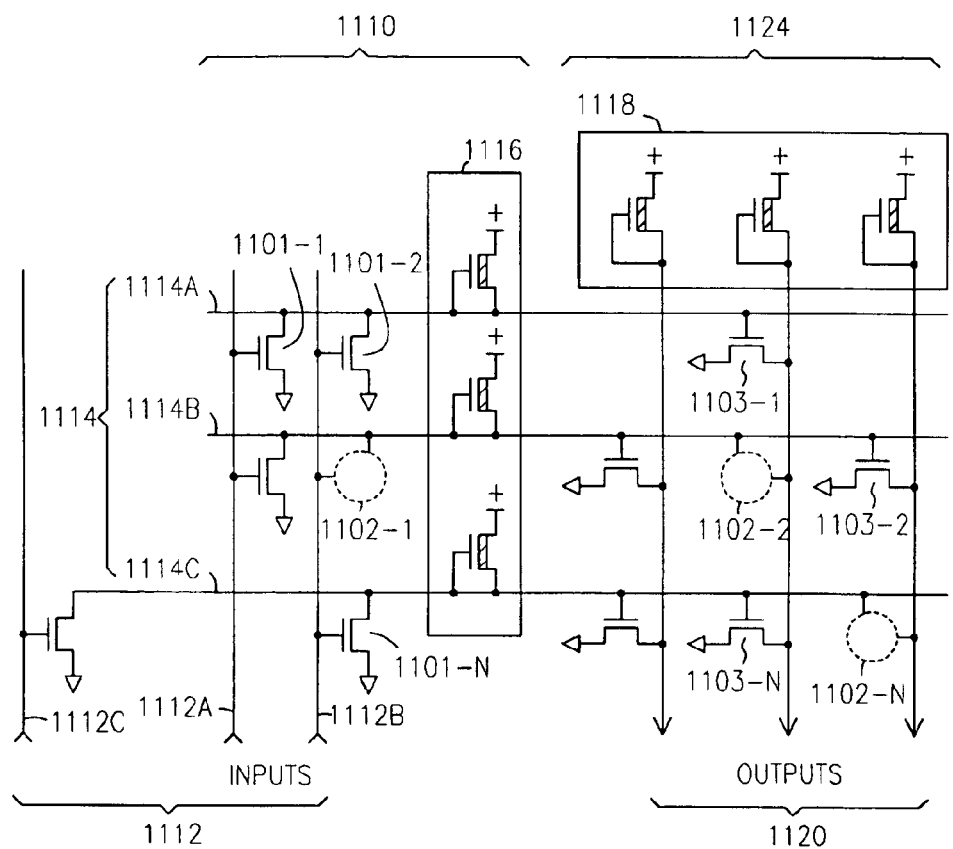
FIG. 11 is a schematic diagram illustrating a conventional NOR—NOR programmable logic array.

FIG. 11 shows a conventional NOR—NOR logic array 1100 which is programmable at the gate mask level by either fabricating a thin oxide gate transistor, e.g. logic cells 1101-1, 1101-2, . . . , 1101-N and 1103-1, 1103-2, . . . , 1103-N, at the intersection of lines in the array or not fabricating a thin oxide gate transistor, e.g. missing thin oxide transistors, 1102-1, 1102-2, . . . , 1102-N, at such an intersection. As one of ordinary skill in the art will understand upon reading this disclosure, the same technique is conventionally used to form other types of logic arrays not shown. As shown in FIG. 1, a number of depletion mode NMOS transistors, 1116 and 1118 respectively, are used as load devices.

The conventional logic array shown in FIG. 11 includes a first logic plane 1110 which receives a number of input signals at input lines 1112. In this example, no inverters are provided for generating complements of the input signals. However, first logic plane 1110 can include inverters to produce the complementary signals when needed in a specific application.

First logic plane 1110 includes a number of thin oxide gate transistors, e.g. transistors 1101-1, 1101-2, . . . , 1101-N. The thin oxide gate transistors, 1101-1, 1101-2, . . . , 1101-N, are located at the intersection of input lines 1112, and interconnect lines 1114. In the conventional PLA of FIG. 11, this selective fabrication of thin oxide gate transistor, e.g. transistors 1101-1, 1101-2, . . . , 1101-N, is referred to as programming since the logical function implemented by the programmable logic array is entered into the array by the selective arrangement of the thin oxide gate transistors, or logic cells, 1101-1, 1101-2, . . . , 1101-N, at the intersections of input lines 1112, and interconnect lines 1114 in the array.

In this embodiment, each of the interconnect lines 1114 acts as a NOR gate for the input lines 1112 that are connected to the interconnect lines 1114 through the thin oxide gate transistors, 1101-1, 1101-2, . . . , 1101-N, of the array. For example, interconnection line 1114A acts as a NOR gate for the signals on input lines 1112A and 1112B. That is, interconnect line 1114A is maintained at a high potential unless one or more of the thin oxide gate transistors, 1101-1, 1101-2, . . . , 1101-N, that are coupled to interconnect line 1114A are turned on by a high logic level signal on one of the input lines 1112. When a control gate address is activated, through input lines 1112, each thin oxide gate transistor, e.g. transistors 1101-1, 1101-2, . . . , 1101-N, conducts which performs the NOR positive logic circuit function, an inversion of the OR circuit function results from inversion of data onto the interconnect lines 1114 through the thin oxide gate transistors, 1101-1, 1101-2, . . . , 1101-N, of the array.

As shown in FIG. 11, a second logic plane 1124 is provided which includes a number of thin oxide gate transistor, e.g. transistors 1103-1, 1103-2, . . . , 1103-N. The thin oxide gate transistors, 1103-1, 1103-2, . . . , 1103-N, are located at the intersection of interconnect lines 1114, and output lines 1120. Here again, the logical function of the second logic plane 1124 is implemented by the selective arrangement of the thin oxide gate transistors, 1103-1, 1103-2, . . . , 1103-N, at the intersections of interconnect lines 1114, and output lines 1120 in the second logic plane 1124. The second logic plane 1124 is also configured such that the output lines 1120 comprise a logical NOR function of the signals from the interconnection lines 1114 that are coupled to particular output lines 1120 through the thin oxide gate transistors, 1103-1, 1103-2, . . . , 1103-N, of the second logic plane 1124. Thus, in FIG. 11, the incoming signals on each line are used to drive the gates of transistors in the NOR logic array as the same is known by one of ordinary skill in the art and will be understood by reading this disclosure.

Figure 12:
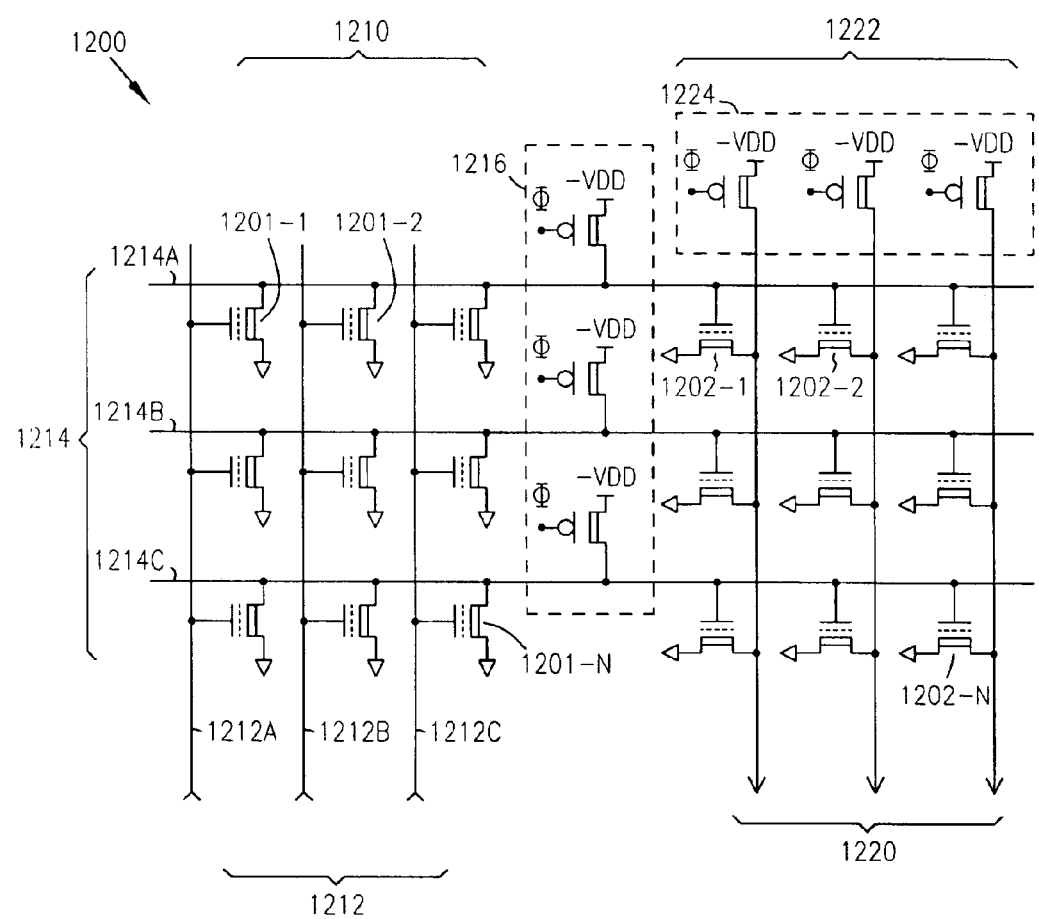
FIG. 12 is a schematic diagram illustrating generally an architecture of one embodiment of a novel in-service programmable logic array (PLA) with floating gate transistors, or logic cells, having graded metal oxide tunnel barrier interpoly insulators according to the teachings of the present invention.

FIG. 12 illustrates an embodiment of a novel in-service programmable logic array (PLA) formed according to the teachings of the present invention. In FIG. 12, PLA 1200 implements an illustrative logical function using a two level logic approach. Specifically, PLA 1200 includes first and second logic planes 1210 and 1222. In this example, the logic function is implemented using NOR—NOR logic. As shown in FIG. 12, first and second logic planes 1210 and 1222 each include an array of, logic cells, non-volatile memory cells, or floating gate driver transistors, 1201-1, 1201-2, ..., 1201-N, and 1202-1, 1202-2, ..., 1202-N respectively, formed according to the teachings of the present invention, e.g. including a graded composition metal oxide tunnel barrier interpoly insultator. The floating gate driver transistors, 1201-1, 1201-2, ..., 1201-N, and 1202-1, 1202-2, ..., 1202-N, have their first source/drain regions coupled to source lines or a conductive source plane, as shown and described in more detail in connection with FIGS. 3 and 5E. These floating gate driver transistors, 1201-1, 1201-2, ..., 1201-N, and 1202-1, 1202-2, ..., 1202-N are configured to implement the logical function of FPLA 1200. The floating gate driver transistors, 1201-1, 1201-2, ..., 1201-N, and 1202-1, 1202-2, ..., 1202-N are shown as n-channel floating gate transistors. However, the invention is not so limited. Also, as shown in FIG. 12, a number of p-channel metal oxide semiconductor (PMOS) transistors are provided as load device transistors, 1216 and 1224 respectively, having their source regions coupled to a voltage potential (VDD). These load device transistors, 1216 and 1224 respectively, operate in complement to the floating gate driver transistors, 1201-1, 1201-2, ..., 1201-N, and 1202-1, 1202-2, ..., 1202-N to form load inverters.

It is noted that the configuration of FIG. 12 is provided by way of example and not by way of limitation. Specifically, the teachings of the present application are not limited to programmable logic arrays in the NOR—NOR approach. Further, the teachings of the present application are not limited to the specific logical function shown in FIG. 12. Other logical functions can be implemented in a programmable logic array, with the floating gate driver transistors, 1201-1, 1201-2, ..., 1201-N, and 1202-1, 1202-2, ..., 1202-N and load device transistors, 1216 and 1224 respectively, of the present invention, using any one of the various two level logic approaches.

First logic plane 1210 receives a number of input signals at input lines 1212. In this example, no inverters are provided for generating complements of the input signals. However, first logic plane 1210 can include inverters to produce the complementary signals when needed in a specific application.

First logic plane 1210 includes a number of floating gate driver transistors, 1201-1, 1201-2, ..., 1201-N, that form an array such as an array of non-volatile memory cells, or flash memory cells. The floating gate driver transistors, 1201-1, 1201-2, ..., 1201-N, are located at the intersection of input lines 1212, and interconnect lines 1214. Not all of the floating gate driver transistors, 1201-1, 1201-2, ..., 1201-N, are operatively conductive in the first logic plane. Rather, the floating gate driver transistors, 1201-1, 1201-2, ..., 1201-N, are selectively programmed, as described in detail below, to respond to the input lines 1212 and change the potential of the interconnect lines 1214 so as to implement a desired logic function. This selective interconnection is referred to as programming since the logical function implemented by the programmable logic array is entered into the array by the floating gate driver transistors, 1201-1, 1201-2, ..., 1201-N, that are used at the intersections of input lines 1212, and interconnect lines 1214 in the array.

In this embodiment, each of the interconnect lines 1214 acts as a NOR gate for the input lines 1212 that are connected to the interconnect lines 1214 through the floating gate driver transistors, 1201-1, 1201-2, ..., 1201-N, of the array 1200. For example, interconnection line 1214A acts as a NOR gate for the signals on input lines 1212A, 1212B and 1212C. Programmability of the vertical floating gate driver transistors, 1201-1, 1201-2, ..., 1201-N is achieved by charging the vertical floating gates. When the vertical floating gate is charged, that floating gate driver transistor, 1201-1, 1201-2, ..., 1201-N will remain in an off state until it is reprogrammed. Applying and removing a charge to the vertical floating gates is performed by tunneling charge between the floating gate and control gates of the floating gate driver transistors, 1201-1, 1201-2, ..., 1201-N through a low tunnel barrier interpoly, or intergate insulator as described in detail above and in connection with FIGS. 2–7C. A floating gate driver transistors, 1201-1, 1201-2, ..., 1201-N programmed in an off state remains in that state until the charge is removed from its vertical floating gate.

Floating gate driver transistors, 1201-1, 1201-2, ..., 1201-N not having a corresponding vertical floating gate charged operate in either an on state or an off state, wherein input signals received by the input lines 1212A, 1212B and 1212C determine the applicable state. If any of the input lines 1212A, 1212B and 1212C are turned on by input signals received by the input lines 1212A, 1212B and 1212C, then a ground is provided to load device transistors 1216. The load device transistors 1216 are attached to the interconnect lines 1214. The load device transistors 1216 provide a low voltage level when any one of the floating gate driver transistors, 1201-1, 1201-2, ..., 1201-N connected to the corresponding interconnect line 1214 is activated. This performs the NOR logic circuit function, an inversion of the OR circuit function results from inversion of data onto the interconnect lines 1214 through the floating gate driver transistors, 1201-1, 1201-2, ..., 1201-N of the array 1200. When the floating gate driver transistors, 1201-1, 1201-2, ..., 1201-N are in an off state, an open is provided to the drain of the load device transistors 1216. The VDD voltage level is applied to corresponding input lines, e.g. the interconnect lines 1214 for second logic plane 1222 when a load device transistors 1216 is turned on by a clock signal received at the gate of the load device transistors 1216 (Φ). Each of the floating gate driver transistors, 1201-1, 1201-2, ..., 1201-N described herein are formed according to the teachings of the present invention as described in detail in connection with FIGS. 2–7C.

In a similar manner, second logic plane 1222 comprises a second array of floating gate driver transistors, 1202-1, 1202-2, ..., 1202-N that are selectively programmed to provide the second level of the two level logic needed to implement a specific logical function. In this embodiment, the array of floating gate driver transistors, 1202-1, 1202-2, ..., 1202-N is also configured such that the output lines 1220 comprise a logical NOR function of the signals from the interconnection lines 1214 that are coupled to particular output lines 1220 through the floating gate driver transistors, 1202-1, 1202-2, ..., 1202-N of the second logic plane 1222.

Programmability of the vertical floating gate driver transistors, 1202-1, 1202-2, ..., 1202-N is achieved by charging the vertical floating gate. When the vertical floating gate is charged, that floating gate driver transistor, 1202-1, 1202-2, ..., 1202-N will remain in an off state until it is reprogrammed. Applying and removing a charge to the vertical floating gates is performed by tunneling charge between the floating gate and control gates of the floating gate driver transistors, 1201-1, 1201-2, ..., 1201-N through a low tunnel barrier interpoly, or intergate insulator as described in detail above and in connection with FIGS. 2–7C. A floating gate driver transistors, 1202-1, 1202-2, ..., 1202-N programmed in an off state remains in that state until the charge is removed from the vertical floating gate.

Floating gate driver transistors, 1202-1, 1202-2, ..., 1202-N not having a corresponding vertical floating gate charged operate in either an on state or an off state, wherein signals received by the interconnect lines 1214 determine the applicable state. If any of the interconnect lines 1214 are turned on, then a ground is provided to load device transistors 1224 by applying a ground potential to the source line or conductive source plane coupled to the transistors first source/drain region as described herein. The load device transistors 1224 are attached to the output lines 1220. The load device transistors 1224 provide a low voltage level when any one of the floating gate driver transistors, 1202-1, 1202-2, . . . , 1202-N connected to the corresponding output line is activated. This performs the NOR logic circuit function, an inversion of the OR circuit function results from inversion of data onto the output lines 1220 through the floating gate driver transistors, 1202-1, 1202-2, . . . , 1202-N of the array 1200. When the floating gate driver transistors, 1202-1, 1202-2, . . . , 1202-N are in an off state, an open is provided to the drain of the load device transistors 1224. The VDD voltage level is applied to corresponding output lines 1220 for second logic plane 1222 when a load device transistor 1224 is turned on by a clock signal received at the gate of the load device transistors 1224 (Φ). In this manner a NOR—NOR electrically programmable logic array is most easily implemented utilizing the normal PLA array structure. Each of the floating gate driver transistors, 1202-1, 1202-2, . . . , 1202-N described herein are formed according to the teachings of the present invention as described in detail in connection with FIGS. 2–7C.

Thus FIG. 12 shows the application of the novel, non-volatile floating gate transistors with low tunnel barrier intergate insulators in a logic array. If a floating gate driver transistors, 1201-1, 1201-2, . . . , 1201-N, and 1202-1, 1202-2, . . . , 1202-N, is programmed with a negative charge on the vertical floating gate it is effectively removed from the array. In this manner the array logic functions can be programmed even when the circuit is in the final circuit or in the field and being used in a system.

The absence or presence of stored charge on the floating gates is read by addressing the input lines 1212 or control gate lines and y-column/sourcelines to form a coincidence in address at a particular floating gate. The control gate line would for instance be driven positive at some voltage of 1.0 Volt and the y-column/sourceline grounded, if the floating gate is not charged with electrons then the transistor would turn on tending to hold the interconnect line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read.

Programming can be achieved by hot electron injection. In this case, the interconnect lines, coupled to the second source/drain region for the non-volatile memory cells in the first logic plane, are driven with a higher drain voltage like 2 Volts for 0.1 micron technology and the control gate line is addressed by some nominal voltage in the range of twice this value. Electrons can also be transferred between the floating gate and the control gate through the low tunnel barrier intergate insulator to selectively program the non-volatile memory cells, according to the teachings of the present invention, by the address scheme as described above in connection with FIGS. 6A–6C. Erasure is accomplished by driving the control gate line with a large positive voltage and the sourceline and/or backgate or substrate/well address line of the transistor with a negative bias so the total voltage difference is in the order of 3 Volts causing electrons to tunnel off of the floating gates to the control gates. Writing can be performed, as also described above, by either normal channel hot electron injection, or according to the teachings of the present invention, by driving the control gate line with a large negative voltage and the sourceline and/or backgate or substrate/well address line of the transistor with a positive bias so the total voltage difference is in the order of 3 Volts causing electrons to tunnel off of the control gates to the floating gates. According one embodiment of the present invention, data can be erased in "bit pairs" since both floating gates on each side of a control gate can be erased at the same time. This architecture is amenable to block address schemes where sections of the array are erased and reset at the same time.

One of ordinary skill in the art will appreciate upon reading this disclosure that a number of different configurations for the spatial relationship, or orientation of the input lines 1212, interconnect lines 1214, and output lines 1220 are possible. That is, the spatial relationship, or orientation of the input lines 1212, interconnect lines 1214, and output lines 1220 can parallel the spatial relationship, or orientation configurations detailed above for the floating gates and control gates as described in connection with FIGS. 5A–5E.

Figure 13:
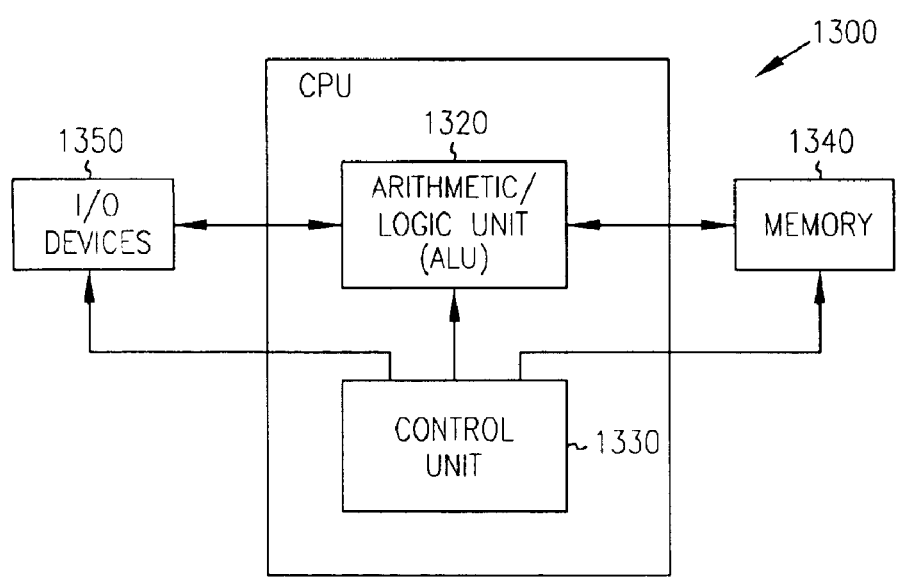
FIG. 13 is a simplified block diagram of a high-level organization of an electronic system according to the teachings of the present invention.

FIG. 13 is a simplified block diagram of a high-level organization of an electronic system 1300 according to the teachings of the present invention. As shown in FIG. 13, the electronic system 1300 is a system whose functional elements consist of an arithmetic/logic unit (ALU), e.g. processor 1320, a control unit 1330, a memory unit 1340, or memory device 1340, and an input/output (I/O) device 1350. Generally such an electronic system 1300 will have a native set of instructions that specify operations to be performed on data by the ALU 1320 and other interactions between the ALU 1320, the memory device 1340 and the I/O devices 1350. The memory devices 1340 contain the data plus a stored list of instructions.

The control unit 1330 coordinates all operations of the ALU 1320, the memory device 1340 and the I/O devices 1350 by continuously cycling through a set of operations that cause instructions to be fetched from the memory device 1340 and executed. In service programmable logic arrays, according to the teachings of the present invention, can be implemented to perform many of the logic functions performed by these components. With respect to the ALU 1320, the control unit 1330 and the I/O devices 1350, arbitrary logic functions may be realized in the "sum-of-products" form that is well known to one skilled in the art. A logic function sum-of-products may be implemented using any of the equivalent two-level logic configurations: AND-OR, NAND-NAND, NOR—OR, OR—NOR, AND-NOR, NAND-AND or OR-AND, and using the novel non-volatile memory cells of the present invention.

CONCLUSION

Graded composition metal oxide barrier tunnel interpoly insulators are described between the floating gate and control gate in a flash memory type devices to form programmable array logic and memory devices. The graded composition metal oxide barrier insulators, ~2.0 eV, are easily fabricated by the oxidation of a transition metal or a composite metal layer. While the amount of charge stored on the floating gate is small the transistor provides gain and charge multiplication resulting in a large output signal and ease of reading the stored data. If there is an adverse capacitance ratio due to a large difference of dielectric constants then the vertical gate structures described previously can be employed.

Write can be achieved by the normal channel hot electron injection and gate current through the silicon oxide to the floating gate. This is done by selecting a particular column by applying a high control gate voltage and applying relatively large drain voltage as is done with conventional ETOX memory devices. However, according to the teachings of the present invention, write can also be accomplished by applying a positive voltage to the substrate or well select line and a large negative voltage to the control gates, electrons will tunnel from the control gate to the floating gate. The graded composition metal oxide tunnel barrier will provide an easy write operation and the selection of the substrate or well bias will provide selectivity and address only one device.

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

It has been shown that the graded composition metal oxide tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the graded composition metal oxide tunnel barrier interpoly dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A device, comprising:
    a first source/drain region and a second source/drain region;
    a channel region located between the first and second source/drain region;
    a floating gate operably positioned proximate to and separated from the channel region;
    a control gate operably positioned proximate to and separated from the floating gate; and
    an intergate insulator positioned between the floating gate and the control gate, the intergate insulator having a thickness and including a mixture of component oxides having varied concentrations to provide a composition gradient across the thickness and provide different barrier heights with respect to the floating gate and the control gate, the component oxides including at least one metal oxide;
    wherein the intergate insulator barrier height is lower at the floating gate and is higher at the control gate to increase electron tunneling from the floating gate to the control gate.

2. The device of claim 1, wherein the floating gate is separated from the channel region by an oxide layer.

3. The device of claim 1, wherein the floating gate includes a polysilicon floating gate, further comprising a metal layer positioned between the floating gate and the intergate insulator.

4. A device, comprising:
    a first source/drain region and a second source/drain region;
    a channel region located between the first and second source/drain region;
    a floating gate operable positioned proximate to and separated from the channel region;
    a control operably positioned proximate to and separated from the floating gate; and
    an intergate insulator positioned between the floating gate and the control gate, the intergate insulator having a thickness and including a mixture of component oxides having varied concentrations to provide a composition gradient across the thickness and provide different barrier heights with respect to the floating gate and the control gate, the component oxides including at least one metal oxide;
    wherein the floating gate includes a polysilicon floating gate, further comprising a metal layer positioned between the floating gate and the intergate insulator; and
    wherein the metal layer includes a metal corresponding to a metal of the metal oxide.

5. The device of claim 3, wherein the metal layer includes Al.

6. The device of claim 3, wherein the metal layer includes a titanium-zirconium (Ti/Zr) alloy.

7. The device of claim 1, wherein the floating gate includes a polysilicon floating gate, further comprising a metal layer positioned between the control gate and the intergate insulator.

8. The device of claim 7, wherein the metal layer includes Al.

9. The device of claim 7, wherein the metal layer includes a noble metal.

10. The device of claim 1, further comprising a first metal layer positioned between the floating gate and the intergate insulator, and a second metal layer positioned between the control gate and the intergate insulator, wherein the first metal layer and the second metal layer have different work functions.

11. A device, comprising:
    a first source/drain region and a second source/drain region;
    a channel region located between the first and second source/drain region;
    a polysilicon floating gate operably positioned proximate to and separated from the channel region by an oxide;
    a control gate operably positioned proximate to and separated from the floating gate; and
    an intergate insulator positioned between the floating gate and the control gate, the intergate insulator having a thickness and including a mixture of component metal oxides having varied concentrations to provide a composition gradient across the thickness and provide different barrier heights with respect to the floating gate and the control gate;
    wherein the intergate insulator barrier height is lower at the floating gate and is higher at the control gate to increase electron tunneling from the floating gate to the control gate.

12. The device of claim 11, wherein the floating gate includes a polysilicon floating gate, further comprising a metal layer positioned between the floating gate and the intergate insulator.

13. The device of claim 11, wherein the floating gate includes a polysilicon floating gate, further comprising a metal layer positioned between the control gate and the intergate insulator.

14. The device of claim 11, further comprising a first metal layer positioned between the floating gate and the intergate insulator, and a second metal layer positioned between the control gate and the intergate insulator, wherein the first metal layer and the second metal layer have different work functions.

15. A device, comprising:
   a first source/drain region and a second source/drain region;
   a channel region located between the first and second source/drain region;
   a polysilicon floating gate operably positioned proximate to and separated from the channel region by an oxide;
   a control gate operably positioned proximate to and separated from the floating gate; and
   an intergate insulator positioned between the floating gate and the control gate, the intergate insulator having a thickness and including transition metal oxides having varied concentrations to provide a composition gradient across the thickness and provide asymmetrical tunnel barriers with the floating gate and the control gate;
   wherein the intergate insulator barrier height is lower at the floating gate and is higher at the control gate to increase electron tunneling from the floating gate to the control gate.

16. The device of claim 15, further comprising a first metal layer positioned between the floating gate and the intergate insulator, and a second metal layer positioned between the control gate and the intergate insulator, wherein the first metal layer and the second metal layer have different work functions.

17. A device, comprising:
   a first source/drain region and a second source/drain region;
   a channel region located between the first and second source/drain region;
   a polysilicon floating gate operably positioned proximate to and separated from the channel region by an oxide;
   a control gate operably positioned proximate to and separated from the floating gate; and
   an intergate insulator positoned between the floating gate and the control gate, the intergate insulator having a thickness and including transition metal oxides having varied concentrations to provide a composition gradient across the thickness and provide asymmetrical tunnel barriers with the floating gate and the control gate;
   a first metal layer positioned between the floating gate and the intergate insulator, and a second metal layer positioned between the control gate and the intergate insulator, wherein the first metal layer and the second metal layer havine different work functions;
   wherein the metal layer includes a metal corresponding to a metal of the metal oxide.

18. The device of claim 16, wherein the first metal layer includes Al.

19. The device of claim 16, wherein the first metal layer includes a titanium-zirconium (Ti/Zr) alloy.

20. The device of claim 16, wherein the second metal layer includes Al.

21. The device of claim 16, wherein the second metal layer includes a noble metal.

22. A device, comprising:
   a first source/drain region and a second source/drain region;
   a channel region located between the first and second source/drain region;
   a polysilicon floating gate operably positioned proximate to and separated from the channel region by an oxide;
   a control gate operably positioned proximate to and separated from the floating gate; and
   an intergate insulator positioned between the floating gate and the control gate, the intergate insulator having a thickness and including $TiO_2$ and $ZrO_2$ having varied concentrations to provide a composition gradient across the thickness and provide asymmetrical tunnel barriers with the floating gate and the control gate;
   wherein the intergate insulator barrier height is lower at the floating gate and is higher at the control gate to increase electron tunneling from the floating gate to the control gate.

23. The device of claim 22, wherein the floating gate includes a polysilicon floating gate, further comprising a metal layer positioned between the floating gate and the intergate insulator.

24. The device of claim 22, wherein the floating gate includes a polysilicon floating gate, further comprising a metal layer positioned between the control gate and the intergate insulator.

25. The device of claim 22, further comprising a first metal layer positioned between the floating gate and the intergate insulator, and a second metal layer positioned between the control gate and the intergate insulator, wherein the first metal layer and the second metal layer have different work functions.

26. A device, comprising:
   a first source/drain region and a second source/drain region;
   a channel region located between the first and second source/drain region;
   a polysilicon floating gate operably positioned proximate to and separated from the channel region by an oxide;
   a control gate operably positioned proximate to and separated from the floating gate; and
   an intergate insulator positioned between the floating gate and the control gate, the intergate insulator having a thickness and including $TiO_2$ and $HfO_2$ having varied concentrations to provide a composition gradient across the thickness and provide asymmetrical tunnel barriers with the floating gate and the control gate;
   wherein the intergate insulator barrier height is lower at the floating gate and is higher at the control gate to increase electron tunneling from the floating gate to the control gate.

27. The device of claim 26, wherein the floating gate includes a polysilicon floating gate, further comprising a metal layer positioned between the floating gate and the intergate insulator.

28. The device of claim 26, wherein the floating gate includes a polysilicon floating gate, further comprising a metal layer positioned between the control gate and the intergate insulator.

29. The device of claim 26, further comprising a first metal layer positioned between the floating gate and the intergate insulator, and a second metal layer positioned between the control gate and the intergate insulator, wherein the first metal layer and the second metal layer have different work functions.

30. A device, comprising:
a first source/drain region and a second source/drain region;
a channel region located between the first and second source/drain region;
a polysilicon floating gate operably positioned proximate to and separated from the channel region by an oxide;
a control gate operably positioned proximate to and separated from the floating gate; and
an intergate insulator positioned between the floating gate and the control gate, the intergate insulator having a thickness and including $ZrO_2$ and $HfO_2$ having varied concentrations to provide a composition gradient across the thickness and provide asymmetrical tunnel barriers with the floating gate and the control gate;
wherein the intergate insulator barrier height is lower at the floating gate and is higher at the control gate to increase electron tunneling from the floating gate to the control gate.

31. The device of claim 30, wherein the floating gate includes a polysilicon floating gate, further comprising a metal layer positioned between the floating gate and the intergate insulator.

32. The device of claim 30, wherein the floating gate includes a polysilicon floating gate, further comprising a metal layer positioned between the control gate and the intergate insulator.

33. The device of claim 30, further comprising a first metal layer positioned between the floating gate and the intergate insulator, and a second metal layer positioned between the control gate and the intergate insulator, wherein the first metal layer and the second metal layer have different work functions.

34. A device, comprising:
a first source/drain region and a second source/drain region;
a channel region located between the first and second source/drain region;
a polysilicon floating gate operably positioned proximate to and separated from the channel region by an oxide;
a control gate operably positioned proximate to and separated from the floating gate; and
an intergate insulator positioned between the floating gate and the control gate, the intergate insulator having a thickness and including $TiO_2$, $ZrO_2$ and $HfO_2$ having varied concentrations to provide a composition gradient across the thickness and provide asymmetrical tunnel barriers with the floating gate and the control gate;
wherein the intergate insulator barrier height is lower at the floating gate and is higher at the control gate to increase electron tunneling from the floating gate to the control gate.

35. The device of claim 34, wherein the floating gate includes a polysilicon floating gate, further comprising a metal layer positioned between the floating gate and the intergate insulator.

36. The device of claim 34, wherein the floating gate includes a polysilicon floating gate, further comprising a metal layer positioned between the control gate and the intergate insulator.

37. The device of claim 34, further comprising a first metal layer positioned between the floating gate and the intergate insulator, and a second metal layer positioned between the control gate and the intergate insulator, wherein the first metal layer and the second metal layer have different work functions.

38. A device, comprising:
a first source/drain region and a second source/drain region;
a channel region located between the first and second source/drain region;
a polysilicon floating gate operably positioned proximate to and separated from the channel region by an oxide;
a control gate operably positioned proximate to and separated from the floating gate; and
an intergate insulator positioned between the floating gate and the control gate, the intergate insulator having a thickness and including $Al_2O_3$ and $SiO_2$ to provide a graded mixed oxide insulator, the $Al_2O_3$ and $SiO_2$ having varied concentrations across the thickness to provide a composition gradient across the thickness and provide asymmetrical tunnel barriers with the floating gate and the control gate;
wherein the intergate insulator barrier height is lower at the floating gate and is higher at the control gate to increase electron tunneling from the floating gate to the control gate.

39. The device of claim 38, wherein the floating gate includes a polysilicon floating gate, further comprising a metal layer positioned between the floating gate and the intergate insulator.

40. The device of claim 38, wherein the floating gate includes a polysilicon floating gate, further comprising a metal layer positioned between the control gate and the intergate insulator.

41. The device of claim 38, further comprising a first metal layer positioned between the floating gate and the intergate insulator, and a second metal layer positioned between the control gate and the intergate insulator, wherein the first metal layer and the second metal layer have different work functions.

42. A vertically-oriented device, comprising:
a pillar of semiconductor material;
a first source/drain region located in the pillar, a second source/drain region located in the pillar and positioned over the first source/drain region, and a channel region located between the first and second source/drain regions;
a floating gate operably positioned adjacent to and separated from the channel region along a side of the pillar;
a control gate operably positioned adjacent to and separated from the floating gate; and
an intergate insulator positioned between the floating gate and the control gate, the intergate insulator having a thickness and including a mixture of component oxides having varied concentrations across the thickness to provide a composition gradient across the thickness and provide different barrier heights at an interface with the floating gate and an interface with the control gate, the component oxides including at least one metal oxide;
wherein the intergate insulator barrier height is lower at the floating gate and is higher at the control gate to increase electron tunneling from the floating gate to the control gate.

43. The device of claim 42, wherein the component oxides include a mixture of $TiO_2$ and $ZrO_2$ in varied concentrations to provide the composition gradient across the thickness of the intergate insulator.

44. The device of claim 42, wherein the component oxides include a mixture of $TiO_2$ and $HfO_2$ in varied concentrations to provide the composition gradient across the thickness of the intergate insulator.

45. The device of claim 42, wherein the component oxides include a mixture of $ZrO_2$ and $HfO_2$ in varied concentrations to provide the composition gradient across the thickness of the intergate insulator.

46. The device of claim 42, wherein the component oxides include a mixture of $TiO_2$, $ZrO_2$ and $HfO_2$ in varied concentrations to provide the composition gradient across the thickness of the intergate insulator.

47. The device of claim 42, wherein the component oxides include a mixture of $Al_2O_3$ and $SiO_2$ in varied concentrations to provide the composition gradient across the thickness of the intergate insulator.

48. A horizontally-oriented device, comprising:
a substrate;
a first source/drain region and a second source/drain region located in the substrate, and a channel region located between the first and second source/drain regions;
a floating gate operably positioned over and separated from the channel region;
a control gate operably positioned over and separated from the floating gate; and
an intergate insulator positioned between the floating gate and the control gate, the intergate insulator having a thickness and including a mixture of component oxides having varied concentrations to provide a composition gradient and provide different barrier heights at an interface with the floating gate and at an interface with the control gate, the component oxides including at least one metal oxide;
wherein the intergate insulator barrier height is lower at the interface with the floating gate and is higher at the interface with the control gate to increase electron tunneling from the floating gate to the control gate.

49. The device of claim 48, wherein the component oxides include a mixture of $TiO_2$ and $ZrO_2$ in varied concentrations to provide the composition gradient across the thickness of the intergate insulator.

50. The device of claim 48, wherein the component oxides include a mixture of $TiO_2$ and $HfO_2$ in varied concentrations to provide the composition gradient across the thickness of the intergate insulator.

51. The device of claim 48, wherein the component oxides include a mixture of $ZrO_2$ and $HfO_2$ in varied concentrations to provide the composition gradient across the thickness of the intergate insulator.

52. The device of claim 48, wherein the component oxides include a mixture of $TiO_2$, $ZrO_2$ and $HfO_2$ in varied concentrations to provide the composition gradient across the thickness of the intergate insulator.

53. The device of claim 48, wherein the component oxides include a mixture of $Al_2O_3$ and $SiO_2$ in varied concentrations to provide the composition gradient across the thickness of the intergate insulator.

54. A device, comprising:
a first source/drain region and a second source/drain region;
a channel region located between the first and second source/drain region;
a floating gate operably positioned proximate to and separated from the channel region;
a control gate operably positioned proximate to and separated from the floating gate; and
an intergate insulator positioned between the floating gate and the control gate, the intergate insulator having different tunnel barriers at an interface with the floating gate and at an interface with the control gate, the intergate insulator being formed using a process including performing a low temperature chemical vapor deposition of a mixture of $TiO_2$ and $ZrO_2$ to vary a composition of the mixture and provide a desired composition gradient across a thickness of the intergate insulator;
wherien the intergate insulator barrier height is lower at the floating gate and is higher at the control gate to increase electron tunneling from the floating gate to the control gate.

55. The device of claim 54, wherein the floating gate is separated from the channel region by a layer of $SiO_2$, the floating gate includes a polysilicon floating gate, and the control gate includes a polysilicon control gate.

56. The device of claim 55, further comprising a first metal layer positioned between the floating gate and the intergate insulator, and a second metal layer positioned between the control gate and the intergate insulator, wherein the first metal layer and the second metal layer have different work functions.

57. A device, comprising:
a first source/drain region and a second source/drain region;
a channel region located between the first and second source/drain region;
a floating gate operably positioned proximate to and separated from the channel region;
a control gate operably positioned proximate to and separated from the floating gate; and
an intergate insulator positioned between the floating gate and the control gate, the intergate insulator having different tunnel barriers at an interface with the floating gate and at an interface with the control gate, the intergrate insulator being formed using a process including performing a low temperature chemical vapor deposition of a mixture of $TiO_2$ and $HfO_2$ to vary a composition of the mixture and provide a desired composition gradient across a thickness of the intergate insulator;
wherein the intergate insulator barrier height is lower at the floating gate and is higher at the control gate to increase electron tunneling from the floating gate to the control gate.

58. The device of claim 57, wherein the floating gate is separated from the channel region by a layer of $SiO_2$, the floating gate includes a polysilicon floating gate, and the control gate includes a polysilicon control gate.

59. The device of claim 58, further comprising a first metal layer positioned between the floating gate and the intergate insulator, and a second metal layer positioned between the control gate and the intergate insulator, wherein the first metal layer and the second metal layer have different work functions.

60. A device, comprising:
a first source/drain region and a second source/drain region;
a channel region located between the first and second source/drain region;
a floating gate operably positioned proximate to and separated from the channel region;
a control gate operably positioned proximate to and separated from the floating gate; and an intergate insulator positioned between the floating gate and the control gate, the intergate insulator having different tunnel barriers at an interface with the floating gate and at an interface with the control gate, the intergrate insulator being formed using a process including performing a low temperature chemical vapor deposition of a mixture of $ZrO_2$ and $HfO_2$ to vary a composition of the mixture and provide a desired composition gradient across a thickness of the intergate insulator;

wherein the intergate insulator barrier height is lower at the floating gate and is higher at the control gate to increase electron tunneling from the floating gate to the control gate.

61. The device of claim 60, wherein the floating gate is separated from the channel region by a layer of $SiO_2$, the floating gate includes a polysilicon floating gate, and the control gate includes a polysilicon control gate.

62. The device of claim 61, further comprising a first metal layer positioned between the floating gate and the intergate insulator, and a second metal layer positioned between the control gate and the intergate insulator, wherein the first metal layer and the second metal layer have different work functions.

63. A device, comprising:
a first source/drain region and a second source/drain region;
a channel region located between the first and second source/drain region;
a floating gate operably positioned proximate to and separated from the channel region;
a control gate operably positioned proximate to and separated from the floating gate; and
an intergate insulator positioned between the floating gate and the control gate, the intergate insulator having different tunnel barriers at an interface with the floating gate and at an interface with the control gate, the intergrate insulator being formed using a process including performing a low temperature chemical vapor deposition of a mixture of $TiO_2$, $ZrO_2$ and $HfO_2$ to vary a composition of the mixture and provide a desired composition gradient across a thickness of the intergate insulator;
wherein the intergate insulator barrier height is lower at the floating gate and is higher at the control gate to increase electron tunneling from the floating gate to the control gate.

64. The device of claim 63, wherein the floating gate is separated from the channel region by a layer of $SiO_2$, the floating gate includes a polysilicon floating gate, and the control gate includes a polysilicon control gate.

65. The device of claim 64, further comprising a first metal layer positioned between the floating gate and the intergate insulator, and a second metal layer positioned between the control gate and the intergate insulator, wherein the first metal layer and the second metal layer have different work functions.

66. A device, comprising:
a first source/drain region and a second source/drain region;
a channel region located between the first and second source/drain region;
a floating gate operably positioned proximate to and separated from the channel region by an oxide;
a control gate operably positioned proximate to and separated from the floating gate; and
an intergate insulator positioned between the floating gate and the control gate, the intergate insulator having different tunnel barriers at an interface with the floating gate and at an interface with the control gate, the intergate insulator being formed using a process including performing a sequential atomic layer deposition process to form layers of $Al_2O_3$ and layers $SiO_2$ with a predetermined thickness and arrangement to vary a composition of the mixture and provide a desired composition gradient across the thickness of the intergate insulator, wherein a region proximate to the floating gate includes more $Al_2O_3$ layers and fewer $SiO_2$ layers than a region proximate to the control gate;
wherein the intergate insulator barrier height is lower at the floating gate and is higher at the control gate to increase electron tunneling from the floating gate to the control gate.

67. The device of claim 66, wherein the floating gate is separated from the channel region by a layer of $SiO_2$, the floating gate includes a polysilicon floating gate, and the control gate includes a polysilicon control gate.

68. The device of claim 67, further comprising a first metal layer positioned between the floating gate and the intergate insulator, and a second metal layer positioned between the control gate and the intergate insulator, wherein the first metal layer and the second metal layer have different work functions.

69. A device, comprising:
a first source/drain region and a second source/drain region;
a channel region located between the first and second source/drain region;
a floating gate operably positioned proximate to and separated from the channel region by an oxide;
a control gate operably positioned proximate to and separated from the floating gate; and
an intergate insulator positioned between the floating gate and the control gate, the intergate insulator having different tunnel barriers at an interface with the floating gate and at an interface with the control gate, the intergate insulator being formed using a process including oxidizing metal alloy films to vary a composition of the mixture and provide a desired composition gradient across the thickness of the intergate insulator.

70. The device of claim 69, wherein oxidizing metal alloy films includes oxidizing transitional metal alloy films.

71. The device of claim 69, further comprising a first metal layer positioned between the floating gate and the intergate insulator, and a second metal layer positioned between the control gate and the intergate insulator, wherein the first metal layer and the second metal layer have different work functions.

* * * * *

UNITED STATES PATENT AND TRADEMARK OFFICE
CERTIFICATE OF CORRECTION

PATENT NO.       : 7,112,841 B2                         Page 1 of 5
APPLICATION NO.  : 10/781035
DATED            : September 26, 2006
INVENTOR(S)      : Eldridge et al.

It is certified that error appears in the above-identified patent and that said Letters Patent is hereby corrected as shown below:

On the title page, item (73), in "Assignee", in column 1, line 1, after "ID" insert -- 83716 --.

On page 2, item (56), under "U.S. Patent Documents", in column 1, line 61, after "6,433,382 B1" insert -- * --.

On page 2, item (56), under "Other Publications", in column 2, lines 6–7, delete "SiO2, Al2O3, and ZrO3 and ZrO2" and insert -- $SiO_2$, $Al_2O_3$, and $ZrO_3$ and $ZrO_2$ --, therefor.

On page 2, item (56), under "Other Publications", in column 2, line 9, delete "Al2O3" and insert -- $Al_2O_3$ --, therefor.

On page 2, item (56), under "Other Publications", in column 2, line 14, delete "studies" and insert -- studied --, therefor.

On page 2, item (56), under "Other Publications", in column 2, lines 24–25, delete "Al2O3 and SiO2" and insert -- $Al_2O_3$ and $SiO_2$ --, therefor.

On page 2, item (56), under "Other Publications", in column 2, line 27, delete "Griener" and insert -- Greiner --, therefor.

On page 2, item (56), under "Other Publications", in column 2, line 33, delete "O2" and insert -- $O_2$ --, therefor.

On page 3, item (56), under "Other Publications", in column 1, line 4, delete "Al-Al2O3-Al" and insert -- Al-$Al_2O_3$–Al --, therefor.

On page 3, item (56), under "Other Publications", in column 1, line 7, delete "TiO2/Si3N4" and insert -- $TiO_2$/$Si_3N_4$ --, therefor.

On page 3, item (56), under "Other Publications", in column 1, line 27, delete "Ta2O5" and insert -- $Ta_2O_5$ --, therefor.

On page 3, item (56), under "Other Publications", in column 1, line 30, delete "TiO2" and insert -- $TiO_2$ --, therefor.

UNITED STATES PATENT AND TRADEMARK OFFICE
CERTIFICATE OF CORRECTION

PATENT NO. : 7,112,841 B2
APPLICATION NO. : 10/781035
DATED : September 26, 2006
INVENTOR(S) : Eldridge et al.

It is certified that error appears in the above-identified patent and that said Letters Patent is hereby corrected as shown below:

On page 3, item (56), under "Other Publications", in column 1, line 31, after "69(25)," insert -- (1996), --.

On page 3, item (56), under "Other Publications", in column 1, line 38, delete "36–69" and insert -- 36–39 --, therefor.

On page 3, item (56), under "Other Publications", in column 1, line 42, delete "TiI4 and H2O2" and insert -- $TiI_4$ and $H_2O_2$ --, therefor.

On page 3, item (56), under "Other Publications", in column 1, line 52, delete "TiO2" and insert -- $TiO_2$ --, therefor.

On page 3, item (56), under "Other Publications", in column 1, line 52, delete "TiI4and H2O–H2O2" and insert -- $TiI_4$ and $H_2O–H_2O_2$ --, therefor.

On page 3, item (56), under "Other Publications", in column 1, line 54, delete "Gd2O3" and insert -- $Gd_2O_3$ --, therefor.

On page 3, item (56), under "Other Publications", in column 1, line 55, delete "Y2O3" and insert -- $Y_2O_3$ --, therefor.

On page 3, item (56), under "Other Publications", in column 1, line 58, delete "ALD–Al2O3" and insert -- $ALD–Al_2O_3$ --, therefor.

On page 3, item (56), under "Other Publications", in column 1, line 60, delete "Ta2O5" and insert -- $Ta_2O_5$ --, therefor.

On page 3, item (56), under "Other Publications", in column 1, line 61, delete "Tox,eq<10A" and insert -- $T_{ox,eq}<10A$ --, therefor.

On page 3, item (56), under "Other Publications", in column 2, line 2, delete "LEss" and insert -- Less --, therefor.

On page 3, item (56), under "Other Publications", in column 2, line 19, delete "VSLI" and insert -- VLSI --, therefor.

On page 3, item (56), under "Other Publications", in column 2, line 22, delete "In2O3" and insert -- $In_2O_3$ --, therefor.

UNITED STATES PATENT AND TRADEMARK OFFICE
CERTIFICATE OF CORRECTION

PATENT NO. : 7,112,841 B2
APPLICATION NO. : 10/781035
DATED : September 26, 2006
INVENTOR(S) : Eldridge et al.

It is certified that error appears in the above-identified patent and that said Letters Patent is hereby corrected as shown below:

On page 3, item (56), under "Other Publications", in column 2, line 22, delete "Physics" and insert -- Physica --, therefor.

On page 3, item (56), under "Other Publications", in column 2, line 30, delete "Al2O3" and insert -- $Al_2O_3$ --, therefor.

On page 3, item (56), under "Other Publications", in column 2, line 32, delete "ZrO2" and insert -- $ZrO_2$ --, therefor.

On page 3, item (56), under "Other Publications", in column 2, line 41, delete "tilanate" and insert -- titanate --, therefor.

On page 3, item (56), under "Other Publications", in column 2, line 48, delete "Similiar" and insert -- Similar --, therefor.

On page 3, item (56), under "Other Publications", in column 2, line 61, delete "TiO2" and insert -- $TiO_2$ --, therefor.

On page 3, item (56), under "Other Publications", in column 2, line 63, delete "TTIP/H2O" and insert -- $TTIP/H_2O$ --, therefor.

On page 4, item (56), under "Other Publications", in column 1, line 9, delete "Ta2 O5" and insert -- $Ta_2O_5$ --, therefor.

On page 4, item (56), under "Other Publications", in column 2, line 6, delete "ZrO2/Zr–silicate/Si" and insert -- $ZrO_2$/Zr–silicate/Si --, therefor.

On page 4, item (56), under "Other Publications", in column 2, lines 6–7, delete "Febricated" and insert -- Fabricated --, therefor.

In column 1, line 8, after "10/177,096" insert -- , --.

In column 1, line 8, after "2002" insert -- , --.

In column 1, line 10, after "09/943,134" insert -- , --.

In column 4, line 13, delete "Electon" and insert -- Electron --, therefor.

UNITED STATES PATENT AND TRADEMARK OFFICE
CERTIFICATE OF CORRECTION

| | |
|---|---|
| PATENT NO. | : 7,112,841 B2 |
| APPLICATION NO. | : 10/781035 |
| DATED | : September 26, 2006 |
| INVENTOR(S) | : Eldridge et al. |

It is certified that error appears in the above-identified patent and that said Letters Patent is hereby corrected as shown below:

In column 4, line 16, delete "Electrochecm" and insert -- Electrochem --, therefor.

In column 5, line 32, delete "an" and insert -- a --, therefor.

In column 16, line 8, after "II" insert -- . --.

In column 17, line 25, after "Process F" insert -- . --.

In column 17, line 29, after "III" insert -- . --.

In column 21, line 4, delete "insultator" and insert -- insulator --, therefor.

In column 27, line 48, in Claim 17, delete "positoned" and insert -- positioned --, therefor.

In column 27, line 59, in Claim 17, delete "havine" and insert -- have --, therefor.

In column 32, line 11, in Claim 54, delete "wherien" and insert -- wherein --, therefor.

In column 32, line 38, in Claim 57, delete "intergrate" and insert -- intergate --, therefor.

In column 33, line 5, in Claim 60, delete "intergrate" and insert -- intergate --, therefor.

In column 33, line 39, in Claim 63, delete "intergrate" and insert -- intergate --, therefor.

UNITED STATES PATENT AND TRADEMARK OFFICE
CERTIFICATE OF CORRECTION

PATENT NO. : 7,112,841 B2
APPLICATION NO. : 10/781035
DATED : September 26, 2006
INVENTOR(S) : Eldridge et al.

It is certified that error appears in the above-identified patent and that said Letters Patent is hereby corrected as shown below:

In column 34, line 52, in Claim 69, after "insulator" insert -- ; wherein the intergate insulator barrier height is lower at the floating gate and is higher at the control gate to increase electron tunneling from the floating gate to the control gate --.

Signed and Sealed this

Sixth Day of March, 2007

JON W. DUDAS
*Director of the United States Patent and Trademark Office*